(12) United States Patent
Schmid et al.

(10) Patent No.: US 10,106,398 B2
(45) Date of Patent: Oct. 23, 2018

(54) MICROMECHANICAL STRUCTURE COMPRISING CARBON MATERIAL AND METHOD FOR FABRICATING THE SAME

(71) Applicant: Infineon Technologies AG, Neubiberg (DE)

(72) Inventors: Ulrich Schmid, Vienna (AT); Tobias Frischmuth, Vienna (AT); Peter Irsigler, Obernberg/Inn (AT); Thomas Grille, Villach (AT); Daniel Maurer, Feld am See (AT); Ursula Hedenig, Villach (AT); Markus Kahn, Rangersdorf (AT); Guenter Denifl, Annenheim (AT); Michael Schneider, Vienna (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/724,224

(22) Filed: May 28, 2015

(65) Prior Publication Data
US 2016/0353210 A1    Dec. 1, 2016

(51) Int. Cl.
*B81C 1/00* (2006.01)
*B81B 3/00* (2006.01)

(52) U.S. Cl.
CPC .......... *B81C 1/00158* (2013.01); *B81B 3/007* (2013.01); *B81B 3/0072* (2013.01); *B81B 2201/0257* (2013.01); *B81B 2203/0118* (2013.01); *B81B 2203/0127* (2013.01); *B81C 2201/0167* (2013.01);

(Continued)

(58) Field of Classification Search
CPC ............. H01L 41/1136; H01L 2224/97; H01L 2924/1461; B81C 1/00158; B81C 1/0015; B81C 1/00134; B81B 3/0072; B81B 2201/0257; B81B 2203/0118; B81B 2203/0127; G01L 9/0058; H04R 2201/003

See application file for complete search history.

(56) References Cited

U.S. PATENT DOCUMENTS 5,943,555 A    8/1999  Shiomi et al.
9,269,831 B2 *  2/2016  Ehrenpfordt ...... H01L 29/66007
(Continued)

FOREIGN PATENT DOCUMENTS

CN    101494814 A    7/2009
DE    69534641 T2    8/2006
(Continued)

OTHER PUBLICATIONS

Srivastava et al, Carbon-Based Electronics: Transistors and Interconnects at the Nanoscale, Mar. 19, 2015, Pan Stanford, pp. 1-26.*

(Continued)

*Primary Examiner* — Marcos D Pizarro
*Assistant Examiner* — Shannon Yi
(74) *Attorney, Agent, or Firm* — Slater Matsil, LLP

(57) ABSTRACT

A micromechanical structure comprises a substrate and a functional structure arranged at the substrate. The functional structure comprises a functional region which is deflectable with respect to the substrate responsive to a force acting on the functional region. The functional structure comprises a carbon layer arrangement, wherein a basis material of the carbon layer arrangement is a carbon material.

33 Claims, 20 Drawing Sheets

(52) U.S. Cl.
CPC ............... *B81C 2201/0177* (2013.01); *B81C 2201/0181* (2013.01); *H04R 2201/003* (2013.01)

(56) References Cited

U.S. PATENT DOCUMENTS

| | | | |
|---|---|---|---|
| 2003/0176007 A1 | 9/2003 | Bertz et al. | |
| 2009/0140357 A1 | 6/2009 | Kupnik et al. | |
| 2010/0301430 A1 | 12/2010 | Huang | |
| 2011/0242932 A1 | 10/2011 | Lebental et al. | |
| 2013/0221453 A1 | 8/2013 | Dehe et al. | |
| 2014/0127446 A1* | 5/2014 | Davis | B81B 3/0078 428/69 |
| 2014/0168224 A1 | 6/2014 | Chleirigh et al. | |
| 2014/0199478 A1 | 7/2014 | Ichikawa et al. | |
| 2014/0270271 A1 | 9/2014 | Dehe et al. | |
| 2015/0203345 A1* | 7/2015 | Sachin | B81B 3/0021 257/415 |
| 2016/0112050 A1* | 4/2016 | Gotsmann | F28F 13/00 331/66 |
| 2016/0123829 A1* | 5/2016 | Reck | H04R 23/008 73/705 |

FOREIGN PATENT DOCUMENTS

| | | |
|---|---|---|
| DE | 102010062555 A1 | 6/2012 |
| DE | 102013203379 A1 | 8/2013 |
| DE | 102014204712 A1 | 9/2014 |
| JP | 4852220 B2 | 1/2012 |
| KR | 101388927 B1 | 4/2014 |
| WO | 2011159351 A2 | 12/2011 |
| WO | 2012141666 A2 | 10/2012 |

OTHER PUBLICATIONS

Tilden, William A., Introduction to the Study of Chemical Philosophy, 1876, D. Appleton and Col., pp. 172, 199-201.*

Gao et al., The Effects of Film Structure and Surface Hydrogen on the Properties of Amorphous Carbon Films, Jun. 17, 2003, American Chemical Society, 107, pp. 11082-11090.*

Ali, N., et al., "Human Micro-Vascular Endothelial Cell Seeding on CR-DLC Thin Films for Mechanical Heart Valve Applications," Thin Solid Films, vol. 515, Issue 1, Sep. 25, 2006, pp. 59-65.

Barata, A., et al., "Characterisation of Chromium Nitride Films Produced by PVD Techniques," Thin Solid Films, vols. 398-399, Nov. 2001, pp. 501-506.

Chang, Yin-Yu, et al., "Structural and Electrical Properties of Cr Doped a-C:H Films Synthesized by a Cathodic-Arc Activated Deposition Process," Surface and Coatings Technology, vol. 200, Issue 10, Feb. 24, 2006, pp. 3170-3174.

Esteve, J., et al., "Cathodic Chromium Carbide Coatings for Molding Die Applications," Surface and Coatings Technology, vols. 188-189, Nov.-Dec. 2004, pp. 506-510.

Gantenbein, P., et al., "Chromium in Amorphous Hydrogenated Carbon Based Thin Films Prepared in a PACVD Process," Carbon, vol. 37, Issue 5, Apr. 9, 1999, pp. 843-846.

Gassner, G., et al., "Structure-Property Relations in Cr—C/a-C:H Coatings Deposited by Reactive Magnetron Sputtering," Surface and Coatings Technology, vol. 200, Issues 1-4, Oct. 1, 2005, pp. 1147-1150.

Gomez, M.A., et al., "Tribological Performance of Chromium/ Chromium Carbide Multilayers Deposited by R.F. Magnetron Sputtering," Surface and Coatings Technology, vol. 200, Issues 5-6, Nov. 21, 2005, pp. 1819-1824.

Han, X., et al., "Structure and Tribological Behavior of Amorphous Carbon Films Implanted with Cr+ Ions," Materials Science and Engineering, vol. 348, Issues 1-2, May 15, 2003, pp. 319-326.

Kok, Y.N., et al., "Raman Spectroscopy Study of C/Cr Coatings Deposited by the Combined Steered Cathodic ARC/Unbalanced Magnetron Sputtering Technique," Surface and Coatings Technology, vol. 200, Issues 1-4, Oct. 1, 2005, pp. 1117-1122.

Kok, Y.N., et al., "Resistance of Nanoscale Multilayer C/Cr Coatings Against Environmental Attack," Surface and Coatings Technology, vol. 201, Issue 6, Dec. 4, 2006, pp. 3596-3605.

Maslar, J.E., et al., "In Situ Raman Spectroscopic Investigation of Chromium Surfaces Under Hydrothermal Conditions," Applied Surface Science, vol. 180, Issues 1-2, Aug. 1, 2001, pp. 102-118.

Robertson, J., "Diamond-Like Amorphous Carbon," Materials Science and Engineering, vol. 37, Issues 4-6, May 24, 2002, pp. 129-281.

* cited by examiner

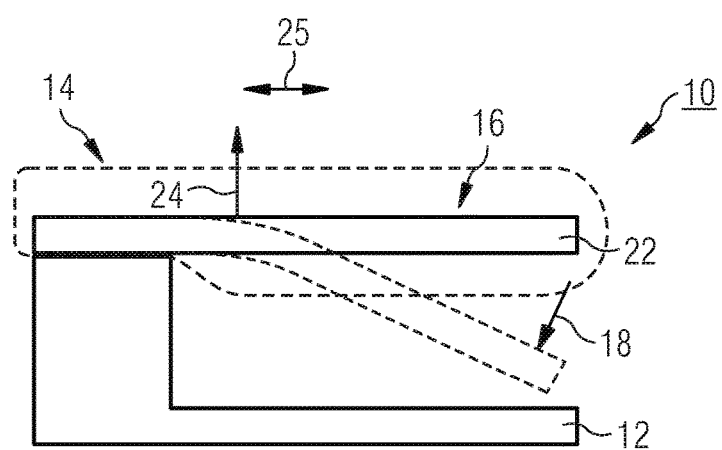

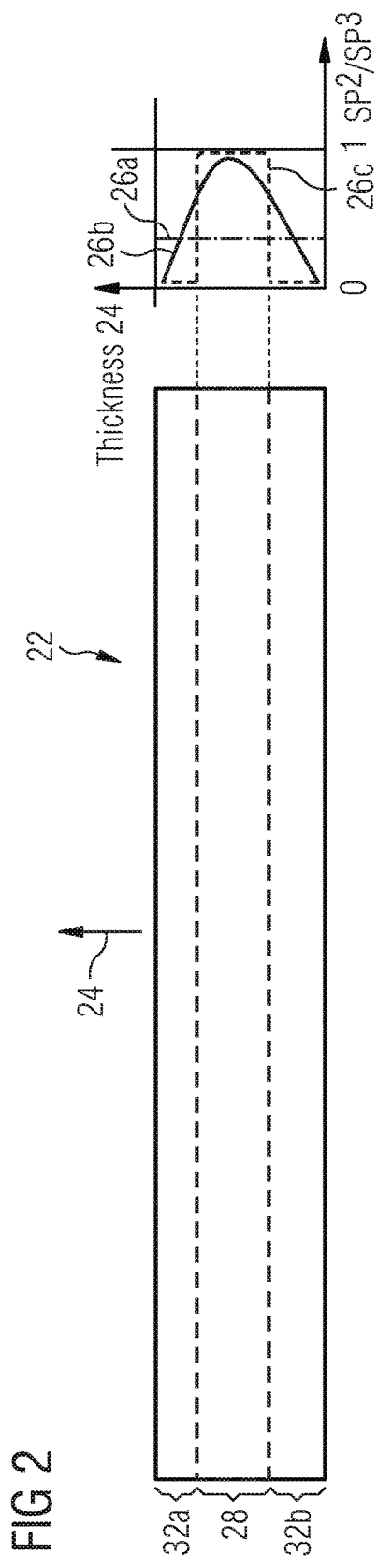

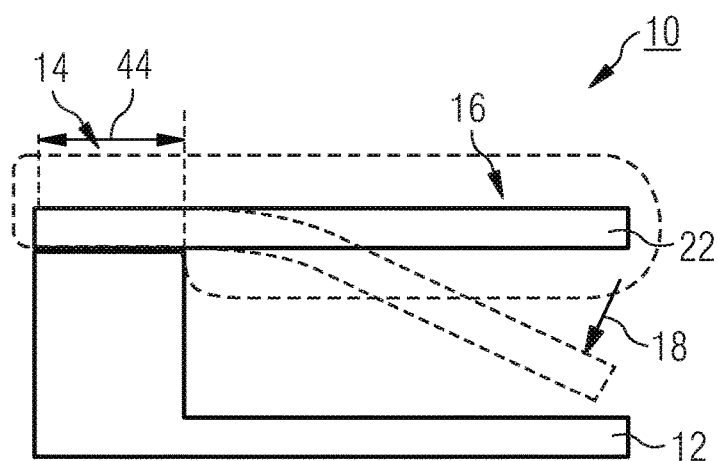

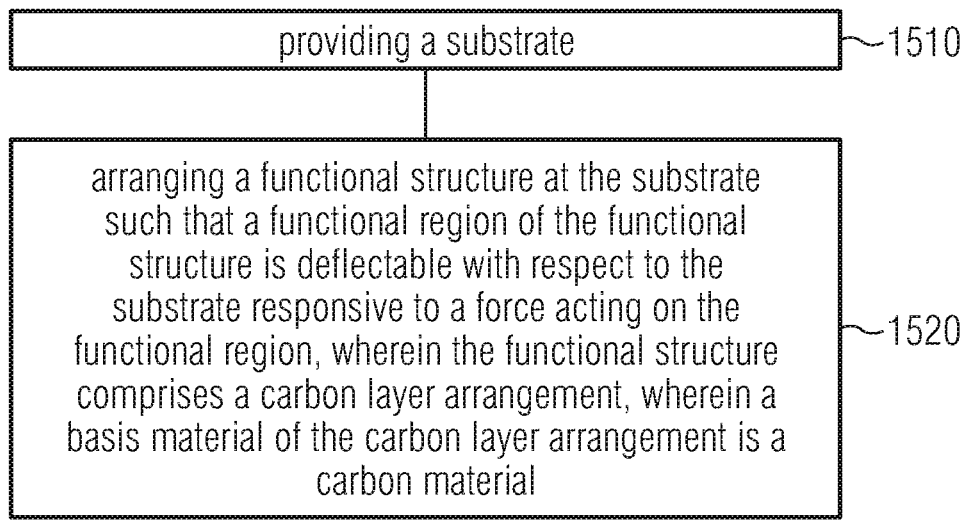
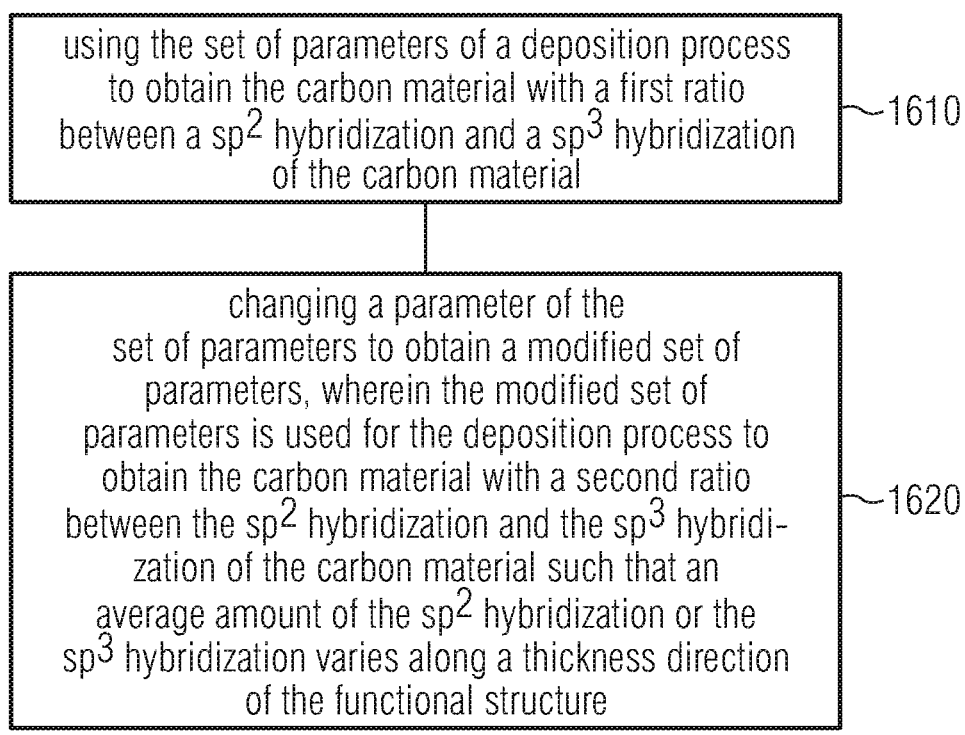

MICROMECHANICAL STRUCTURE COMPRISING CARBON MATERIAL AND METHOD FOR FABRICATING THE SAME

TECHNICAL FIELD

The invention relates to micromechanical structures. The invention further relates to a micromechanical structure membrane comprising a carbon-containing thin film.

BACKGROUND

The term microelectromechanical system (MEMS) or micromechanical system/structure (MMS) is often used to refer to small integrated devices or systems that combine electrical and mechanical components. When focusing on the micromechanical part, the term "micromechanical system" may be used to describe small integrated devices or systems which comprise one or more micromechanical elements and possibly, but not necessarily, electrical components and/or electronic components.

Micromechanical systems may be used as, for example, actuators, transducers or sensors, e.g. pressure sensors. Pressure sensors are nowadays mass products in automobile electronics and consumer goods electronics. For many of these applications, systems are used in which the sensor is integrated in an application-specific integrated circuit (ASIC). For example, Infineon Technologies AG offers such a system as a side-airbag sensor.

In particular, the mechanically active elements of a micromechanical system may typically require relatively complex structures, such as recesses, beams, cantilevers, undercuts, cavities, etc. Possibly, a relatively high number of manufacturing steps are required. Furthermore, the process used for performing the micromechanical system may need to be compatible with possible subsequent manufacturing steps that are used for creating electrical and/or electronic components, for example.

Micromechanical systems or structures (MMS) may comprise deflectable structures such as membranes. A microelectromechanical structure (MEMS) may comprise one or more micromechanical structures whose deflectable structure may be deflected electrically (actuator). Alternatively or in addition, the MEMS may provide an electrical signal responsive to a deflection of the deflectable structure of the MMS (sensor). Movement of the deflected structure may lead to mechanical stress. Thus, there is a need to provide micromechanical structures with improved durability and/or deflection performance.

SUMMARY

The inventors have found that a durability and/or a deflection performance of a micromechanical structure may be improved when a carbon material is a basis material of a functional structure or of a functional region which is deflectable or when the carbon material is a basis material of a layer thereof.

Embodiments provide a micromechanical structure comprising a substrate and a functional structure arranged at the substrate. The functional structure comprises a functional region which is deflectable with respect to the substrate responsive to a force acting on the functional region. The functional structure comprises a carbon layer arrangement, wherein a basis material of the carbon layer arrangement is a carbon material.

Further embodiments provide a micromechanical structure comprising a substrate and a functional structure arranged at the substrate. The functional structure comprises a functional region which is deflectable with respect to the substrate responsive to a force acting on the functional region. The functional structure comprises a base layer arrangement and a functional layer. A basis material of the functional layer is a carbon material.

Further embodiments provide a method for fabricating a micromechanical structure. The method comprises providing a substrate and arranging a functional structure at the substrate such that a functional region of the functional structure is deflectable with respect to the substrate responsive to a force acting on the functional region. The functional structure comprises a carbon layer arrangement, wherein a basis material of the carbon layer arrangement is a carbon material.

Further embodiments provide a method for fabricating a micromechanical structure. The method comprises providing a substrate and arranging a functional structure at the substrate, the functional structure comprising a base layer arrangement and a functional layer, wherein a basis material of the functional layer is a carbon material. The functional structure is arranged such that a functional region of the functional structure is deflectable with respect to the substrate responsive to a force acting on the functional region.

Further embodiments provide a micromechanical sound transducer.

BRIEF DESCRIPTION OF THE DRAWINGS

Embodiments of the present invention are described herein making reference to the appended drawings.

FIG. 1 shows a schematic side view of a micromechanical structure according to an embodiment;

FIG. 2 shows a schematic side view a carbon layer arrangement and plots illustrating different relations between portions having different types of hybridization of a carbon material, according to an embodiment;

FIG. 5 shows a schematic side view of the micromechanical structure illustrated in FIG. 1;

FIG. 15 illustrates a schematic flowchart of a method for fabricating a micromechanical structure, according to an embodiment;

FIG. 16 illustrates a schematic flowchart of a method which may be used during a step of the method illustrated in FIG. 15, according to an embodiment;

DETAILED DESCRIPTION OF ILLUSTRATIVE EMBODIMENTS

Figure 3A:
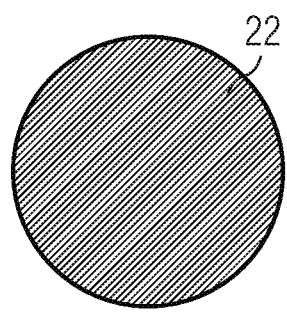
FIGS. 3a-d each show a schematic top or bottom view of a possible implementation of the carbon layer arrangement, according to an embodiment.

Before embodiments of the present invention will be described in detail using the accompanying figures, it is to be pointed out that the same or functionally equal elements are given the same reference numbers in the figures and that a repeated description for elements provided with the same or similar reference numbers is typically omitted. Hence, the descriptions provided for elements having the same reference numbers are mutually exchangeable and applicable.

Usually, microphones and/or micro speakers realized as micro electromechanical structure (MEMS) are manufactured in silicon technology. Silicon micro-machined microphones are capacitive transducers including a flexible membrane moving in the sound field and a static perforated electrode which is called a backplate. In the concept of excessive pressure, the membrane can be subjected to pressure differences up to 10 bar. In such cases, typical membranes fail since their fracture strengths, respectively a maximum mechanical load the membrane may tolerate (break resistance) is exceeded.

The complementary transducer is a micro speaker that needs to be actuated such that a large stroke displacement is achieved, for example, by a capacitive actuation, to drive a large air displacement and hence acceptable sound pressure.

A deflectable component of a micromechanical structure such as a membrane of a sound transducer may be clamped, i.e. fixed at a fixed (clamped) portion and cantilevered or, i.e. vibratable or deflectable, at a deflectable portion. The membrane may thus be denoted as a cantilevered structure.

The deflectable component may be stressed mechanically during deflection. Mechanical stress may arise, for example, due to material strains. For example, material stress of a cantilever beam may be maximal at an end of the cantilever beam adjacent to the clamped portion thereof. Further, mechanical stress may arise, for example, at portions of the deflectable component that abuts other components or a substrate. Such abutting portions may be located at regions or portions of the deflectable component that show high amplitudes of deformation such as a deflectable end of the cantilevered beam, at regions where a distance to other components is small and/or at regions where the clamping portion ends.

Also, other parameters of the deflectable components may be required to be adapted. For example, a membrane may be required to comprise a conductivity for electrical currents. The conductivity may be required to be increased (less electrical resistance) or decreased (higher electrical resistance) sectionally or in total, i.e., at the complete structure.

Parameters of a carbon material may be adapted by applying other materials that form a compound with the carbon material. For example, a carbon material may be doped to adapt a generation of holes and/or electrons. Alternatively or in addition, a type of hybridization of the carbon material may influence mechanical and/or electrical properties of the carbon material. As will be explained in more detail below, one or more characteristics of the carbon material may be adapted while maintaining the carbon material as a basis material of the structure or layer. This may allow for a high flexibility of structures.

A hardness, a stiffness and/or a conductivity of carbon material may be manipulated by adding further materials. The further material may be referred to as a doping material. The doping material may be, a for example, a metal material or a different material. The metal material may be, for example, a metal, a transition metal and/or a metalloid. For example, a first type of doping materials such as boron (B) or silicon (Si) may be added for obtaining a covalently formed carbide. This may allow for an increased stiffness or hardness. A second type of doping materials may allow for obtaining metallic carbides. Materials of the second type may be, for example, a metal material such as titan (Ti), zirconium (Zr) hafnium (Hf) vanadium (V) niobium (Nv), tantalum (Ta) chromium (Cr) molybdenum (Mo) tungsten (W), manganese (MN) or the like. Alternatively or in addition, other materials such as nitrogen (N) fluorine (F), aluminum (Al), silver (Ag), iron (Fe), cobalt (Co), phosphorus (P) or lithium (Li) may be added. Independent from one or more types of materials used, the carbon material may remain a basis material, i.e., the material which is mainly arranged or present.

In the following, reference will be made to carbon materials comprising different types of hybridizations. A type hybridization of a carbon material may be, for example, sp, $sp^2$ or $sp^3$. Carbon materials having the $sp^2$ hybridization may comprise, for example, a lower stiffness or hardness when compared to carbon materials having the $sp^3$ hybridization. Materials comprising carbon having the $sp^2$ hybridization may comprise a higher conductivity when compared to materials comprising the carbon material having the $sp^3$ hybridization.

Effects of the mechanical stress, such as signs of fatigue (e.g. a fatigue break or a static deformation) of the deflectable component due to strains or hits/abutting may be reduced by arranging a functional structure comprising a carbon layer arrangement having a basis material being carbon material. Thus, fabricated components such as membranes or beams of micro mechanical structures (MMS) may be improved with respect to silicon-based manufacturing technologies when regarding the reliability and loadability.

FIG. 1 shows a schematic side view of a micromechanical structure 10 comprising a substrate 12 and a functional structure 14 arranged at the substrate 12. The functional structure 14 may comprise a functional region 16. The functional region 16 may be configured to provide a mechanically active area and to deflect with respect to the substrate 12 responsive to a force 18 acting on the functional region 16. The functional structure 14 comprises a carbon layer arrangement 22. A basis material of the carbon layer arrangement 22 is a carbon material. The carbon material may be an amorphic carbon material and/or may comprise one or more types of hybridizations. The term basis material may refer to a material which is mainly or basically forming the carbon layer arrangement 22.

An average amount of the carbon material in the carbon layer arrangement 22 may vary along a thickness direction 24 and/or along a direction perpendicular to the thickness direction 24. The thickness direction 24 may be a (shortest) direction that is arranged perpendicular to lateral directions along which the functional structure 14 expands the most.

The thickness direction 24 may be arranged parallel to a surface normal of the functional structure 14 and/or with respect to a surface at which the force 18 is acting. The surface normal may be parallel to the thickness direction 24 when the functional structure 14 comprises a rest position. In the rest position, the functional structure 14 may be undeflected.

The carbon layer arrangement may comprise a mixture or doping of the carbon material with further materials such as a type of doping materials described above. Based on a varying degree of a doping of the carbon material with one or more other materials along the thickness direction 24 and/or a direction perpendicular to the thickness direction 24, the average amount of carbon material may vary in the carbon layer arrangement 22. A region of the carbon layer arrangement may comprise an average amount of the carbon material, being at least 90%. Alternatively, the average amount may be at least 93% or 96%. The region to which the average amount refers may be a defined section of the carbon layer arrangement 22, but may also be the carbon layer arrangement 22 itself.

The carbon material of the carbon layer arrangement may comprise a doping material. An average concentration of the doping material may be, for example, at least 0.001%, at least 0.002%, at least 0.005% or at least $10^{18}$ per cm$^3$. at a region of the carbon layer arrangement 22. Alternatively or in addition, an average concentration of the doping material may be, for example, at most 15%, at most 12% or at most 10%.

The carbon material may allow for a high stiffness of the functional structure 16. An extension of the functional structure 16 along a direction 25 perpendicular to the thickness direction 24 may thus be large when compared to the extension along the thickness direction 24. For example, the extension along the direction 25 may be at least one time and at most 1000 times of the extension along the thickness direction 24. Alternatively, the extension along the direction 25 may be at least one time and at most 500 times or at least one time and at most 50 times when compared to the extension along the direction 24. Other embodiments provide functional structures comprising an extension along the direction 25 being larger than 5000 times of the thickness of the functional structure 16 along the thickness direction 24.

In other words, the functional structure may comprise a carbon-membrane or a carbon-composite-membrane.

FIG. 2 shows a schematic side view of the carbon layer arrangement 22. The carbon layer arrangement 22 comprises the carbon material. The carbon material may comprise a first portion and a second portion. A first portion may have the sp$^2$ hybridization of the carbon material. A second portion may have the sp$^3$ hybridization.

FIG. 2 further shows plots 26a-c illustrating different relations between the first portion and the second portion along the thickness direction 24. The plots may be understood schematically. A value of zero at the abscissa depicting the sp$^2$/sp$^3$ ratio may relate to "no sp$^2$ hybridization arranged", wherein a value of one may refer to "no sp$^3$ hybridization arranged", i.e., only sp$^2$ hybridization arranged.

A first plot 26a shows a constant ratio or proportion between the sp$^2$ and sp$^3$ hybridization along the thickness direction 24.

The plot 26b schematically illustrates an increasing share of the sp$^2$ hybridization from a minimum or maximum thickness in a direction of a center region 28 of the carbon layer arrangement. I.e., outer regions 32a and/or 32b arranged at low and/or high thickness values may cover, sandwich or enclose the center region 28 of the carbon layer arrangement 22. A high amount of the sp$^2$ hybridization may be arranged in the center region 28 when compared to carbon material having the sp$^3$ hybridization and/or when compared to the outer regions 32a and/or 32b. A variation of the ratio may be continuously along the thickness direction 24 as depicted by the plot 26b. As depicted in plot 26c, the variation may also change stepwise.

The carbon layer arrangement 22 may be described as comprising the carbon material having a high ratio of sp$^2$ hybridization in the center region 28. This may allow for the center region 28 having a high conductivity, a low stiffness and/or hardness when compared to the outer regions 32a and 32b having a high ratio of the carbon material in the sp$^3$ hybridization.

In contrast, the outer regions 32a and 32b may comprise a low conductivity and/or a high stiffness when compared to the center region 28. Thus, although the carbon layer arrangement 22 may be completely be formed by a basis material being carbon, a stiffness profile and/or a conductivity profile may be obtained.

For example, the center region 28 may be connected to an electric potential and may be moved based on an electric field between the electric potential and a further electric potential at an adjacent electrode, for example, in terms of a loudspeaker. The outer regions 32a and/or 3b may allow for passivation of the center region 28. I.e., the variation of the ration between the sp$^2$ hybridization and the sp$^3$ hybridization may allow for electrically insulating the center region 28.

Alternatively, a capacitive effect may be utilized, for example, when the force 18 deflects the carbon layer arrangement 22, e.g., in terms of a microphone.

Alternatively, any other pathway of the ratio between the sp$^2$ and the sp$^3$ hybridization may be obtained, such as only increasing along the thickness direction 24, only decreasing along the thickness direction 24, being partially or completely constant at a value of the ratio and/or a combination thereof.

As described above, the carbon layer arrangement 22 may additionally comprise a doping material.

FIGS. 3a-d each show a schematic top or bottom view of a possible implementation of the carbon layer arrangement 22.

FIG. 3a shows the carbon layer arrangement 22 having a base area with a round shape. A round shape may be advantageous when the carbon layer arrangement 22; the functional region 16 respectively is at least a part of a deflectable membrane.

Figure 3B:
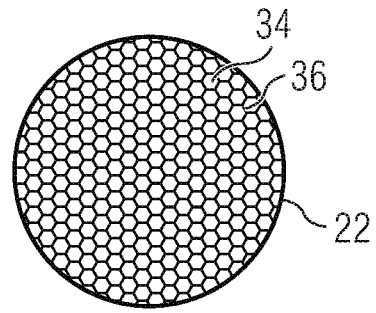

FIG. 3b shows the carbon layer arrangement 22 comprising a base area having a round shape and a honeycomb structure. The honeycomb structure may comprise a plurality of honeycombs 34, wherein the honeycombs 34 may be formed as recesses. The honeycombs may comprise, for example, a hexagonal shape or a different polygon shape.

Braces 36 may comprise a low spatial extent when compared to a solid structure.

Figure 3C:
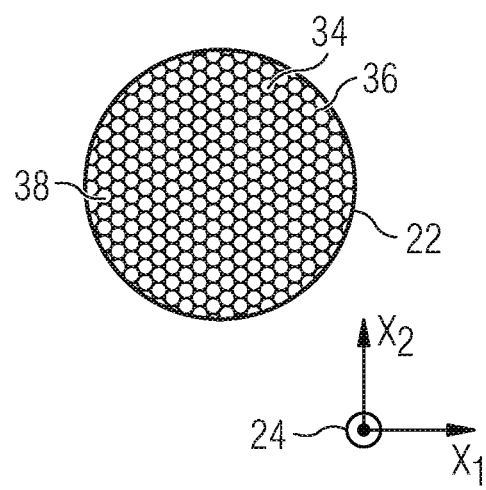

FIG. 3c shows a schematic top view of the carbon layer arrangement 22 comprising a round shape of the base area, wherein the honeycomb structure comprises the recesses 34 formed as a circle. This may lead to a varying extent of the material of the braces 36 along a first and/or a second lateral direction (X1 and/or X2) arranged perpendicular to the thickness direction 24. At connection points 38 between two or more recesses 34, the extent along the first lateral direction X1 and/or the second lateral direction X2 may be higher, when compared to extensions of connection points of the honeycomb structure depicted in FIG. 3b. This may lead to a higher stability of the modified honeycomb structure.

Figure 3D:
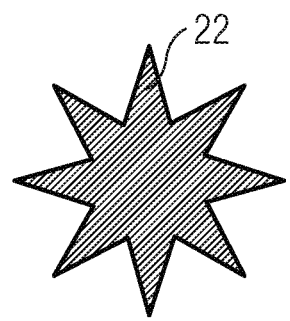

FIG. 3d schematically shows a top view or bottom view of the carbon layer arrangement 22 comprising a base area having a star shape. Alternatively, the carbon layer arrangement may comprise a base area having a shape according to a circular shape, a ring shape, a star shape, a polygon shape, an elliptical shape, a honeycomb structured shape or a combination thereof.

The functional structure and/or the carbon layer arrangement may be at least a part of a membrane structure. A micromechanical structure comprising the functional structure and the carbon layer arrangement may be part of a sound transducer structure.

Figure 4A:
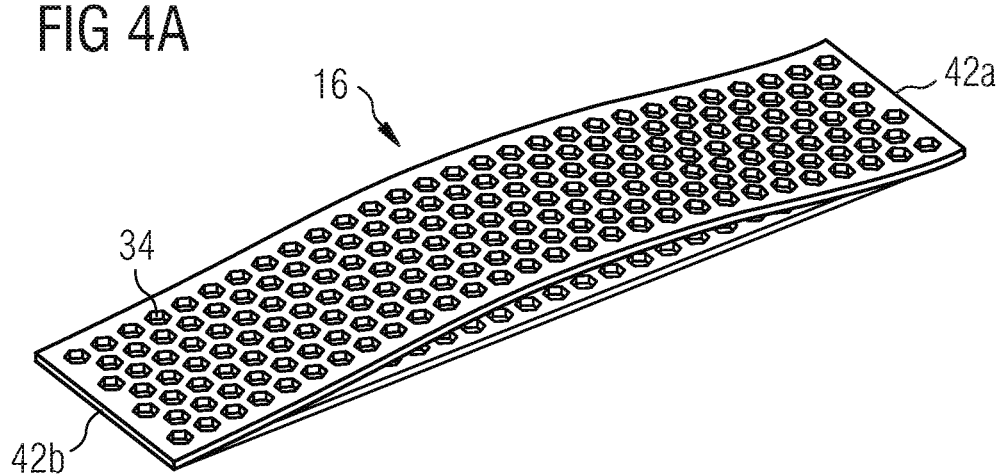
FIG. 4a shows a schematic perspective view of a functional region comprising recesses which comprise a hexagonal shape, according to an embodiment.

FIG. 4a shows a schematic perspective view of the functional region 16, wherein the recesses 34 comprise a hexagonal shape, as described with respect to FIG. 3b. The functional structure 16 may be clamped or fixed at a first end 42a and/or at a second end 42b. Alternatively, the functional region 16 may be fixed or clamped at a circumferential area thereof, for example, to provide a function of a deflectable membrane.

Figure 4B:
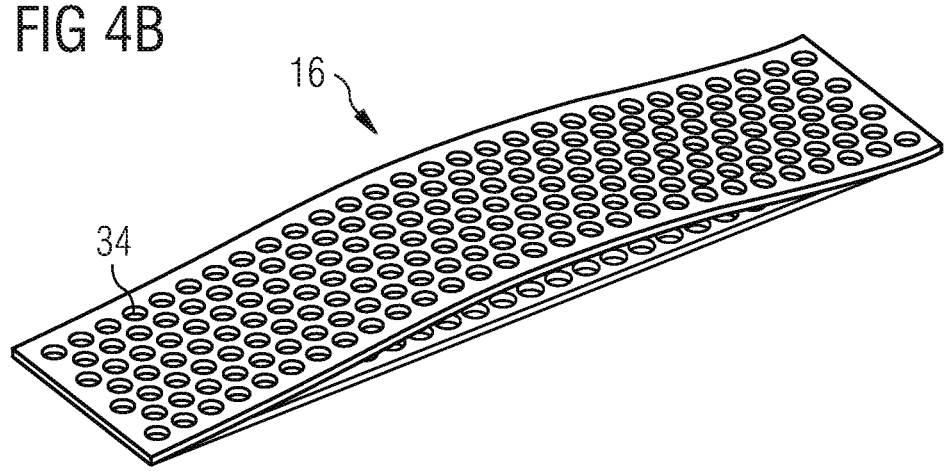
FIG. 4b shows a schematic perspective view of the functional region, wherein the recesses comprise a round shape, according to an embodiment.

FIG. 4b shows a schematic perspective view of the functional region 16, wherein the recesses 34 comprise a round shape, as it is described with respect to FIG. 3c.

FIG. 5 shows a schematic side view of the micromechanical structure 10. The micromechanical structure 10 comprises a cantilevered portion and the deflectable functional region 16. The cantilevered portion may be a portion of the carbon layer arrangement 22 being fixed or clamped to the substrate 12, i.e., the carbon layer arrangement 22 may stay at its position, when the force 18 acts on the functional region 16.

Figure 6A:
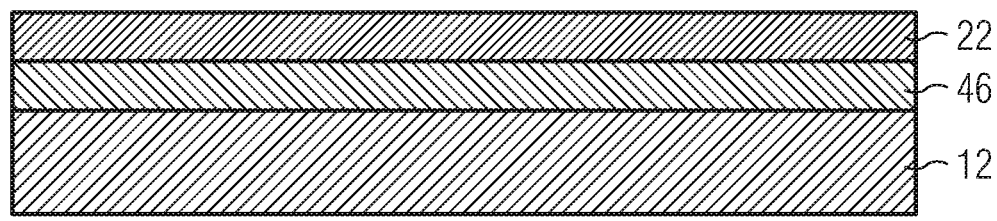
FIG. 6a shows a schematic side view of a further micromechanical structure according to an embodiment.

FIG. 6a shows a schematic side view of a micromechanical structure 20, wherein the carbon layer arrangement 22 is arranged at a layer 46 being arranged between the carbon layer arrangement 22 and the substrate 12. For example, the substrate 12 may be a semiconductor substrate such as a silicone substrate. The layer 46 may comprise a dielectric material and may allow for an insulation between the carbon layer arrangement 22 and the substrate 12. The layer 46 may be arranged such that the carbon layer arrangement is fully coated with respect to the substrate 12.

A first portion of the carbon material having the $sp^3$ hybridization may be at least 30%, at least 50% or at least 70% of the carbon material. The portion may be at most 90%, at most 85% or at most 80%.

A second portion of the carbon material may comprise the $sp^2$ hybridization. The portion, when present, may be at least 30% and at most 99%, at least 40% and at most 95% or at least 50% and at most 85%. The portion comprising the $sp^2$ hybridization and the portion comprising the $sp^3$ hybridization together may comprise at most 100% of the carbon material. Additionally, portions of the carbon material may comprise other types of hybridization such as the sp hybridization.

Figure 6B:
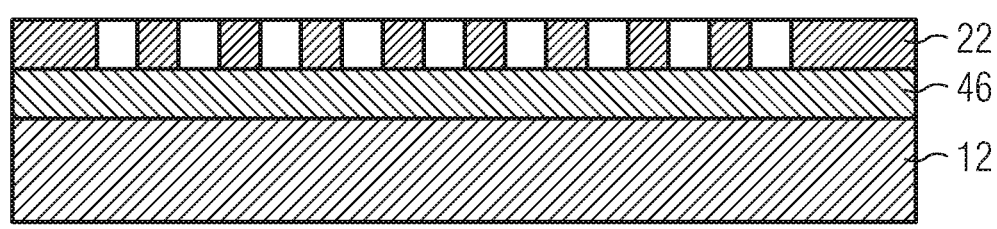
FIG. 6b shows a schematic side view of a further micromechanical structure comprising a structured carbon layer arrangement, according to an embodiment.

FIG. 6b shows a schematic side view of a micromechanical structure 30 comprising a structured carbon layer arrangement 22, for example, having a honeycomb structure and/or a structure as described with respect to FIGS. 3a-d.

The micromechanical structures 22 and/or 30 may be used for further processing as will be described with respect to FIGS. 7a and 7b.

Figure 7A:
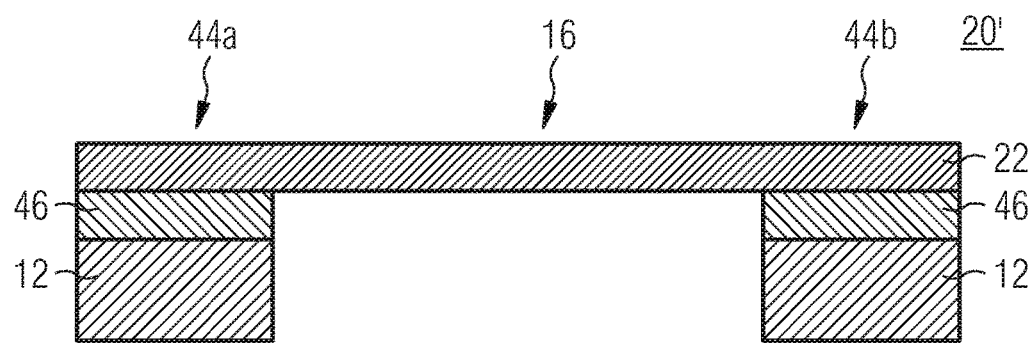
FIG. 7a shows a schematic side view of a micromechanical structure which may be obtained, when processing the micromechanical structure depicted in FIG. 6a, according to an embodiment.

FIG. 7a shows a schematic side view of a micromechanical structure 20' which may be obtained, for example, when processing the micromechanical structure depicted in FIG. 6a. The substrate 12 and/or the layer 46 may be partially removed to obtain the functional region 16. Simplified, the function region 16 may be obtained by exposing or uncovering the carbon layer arrangement 22 from the layer 46 and/or the substrate 12. The functional structure may be used, for example, as a membrane which is fixed or clamped at regions 44a and 44b.

Figure 7B:
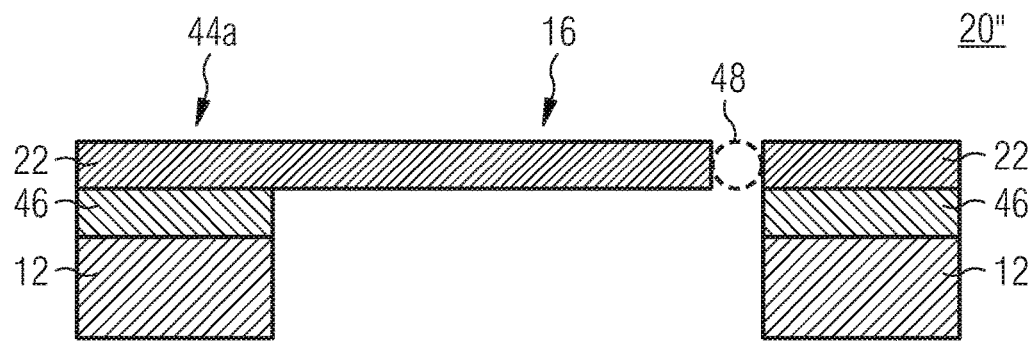
FIG. 7b shows a schematic side view of a micromechanical structure, which may be obtained, when removing a portion of the carbon layer arrangement illustrated in FIG. 7a and according to an embodiment.

FIG. 7b shows a schematic side view of a micromechanical structure 20", which may be obtained, when removing a portion of the carbon layer arrangement 22 such that the function region 16 may be used as a bending beam structure being fixed or clamped at one side (region 44a). At a region 48, the carbon layer arrangement 22 may be removed.

The micro mechanical structure 30 may be processed accordingly.

The carbon layer arrangement 22 depicted in FIG. 6a may be generated, for example, by a depositing process, for example, using a chemical vapor deposition (CVD) process, a physical vapor deposition (PVD) process and/or an epitaxial growth process. An implantation process, for example, an intrinsic implantation process, may be performed for implanting a doping material into the carbon layer arrangement 22. The carbon layer arrangement may be annealed, for example, after having performed an implantation process to obtain a cured or annealed structure of the carbon layer arrangement 22.

Figure 8A:
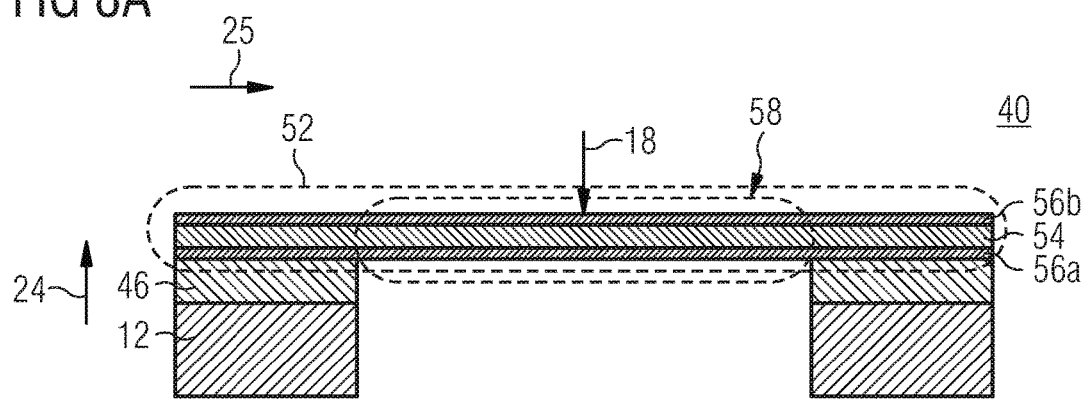
FIG. 8a shows a schematic side view of a micromechanical structure comprising a substrate and a functional structure arranged at the substrate, according to an embodiment.

FIG. 8a shows a schematic side view of a micromechanical structure 40 comprising the substrate 12 and a functional structure 52 arranged at the substrate. The functional structure 52 may comprise a functional region 58 being deflectable with respect to the substrate 12 responsive to the force 18 acting on the functional region 58. For example, the functional region 58 may be configured to act as a membrane structure. For example, the base layer arrangement 54 may be a membrane which may be encapsulated by the functional layers 56a and/or 56b.

Between the substrate and the functional structure 52 the dielectric layer 46 may be arranged, for example, an insulating layer comprising an insulator material such as a silicon-oxide material and/or silicon-nitride material. Alternatively, a different layer may be arranged between the substrate 12 and the functional structure 52. Alternatively, the functional structure 52 may be directly arranged at the substrate 12.

The functional structure 52 may comprise a base layer arrangement 54 and one or more functional layers 56a and/or 56b. The base layer arrangement 54 may comprise a conductive material, such as a doped semiconductor material, e.g., a doped polysilicon material. Alternatively, the base layer arrangement 54 may comprise a carbon material, which may have the $sp^2$ hybridization and/or a carbon material having the $sp^3$ hybridization.

A basis material of the functional layer 56a and/or of the functional layer 56b may be a carbon material. For example, the functional layer 56a and/or the functional layer 56b may be formed as was described with respect to the carbon layer arrangement 22. An average amount of the carbon material in the functional layer 56a and/or 56b may be at least 90%, at least 93% or at least 96% at a region of the functional layer.

For example, the functional layer 56a and/or the functional layer 56b may comprise a high amount of a carbon material having the $sp^3$ hybridization. This may allow for an insulation and/or a passivation of an electrical current or an electrical potential applied to the base layer arrangement 54 with respect to the substrate 12. This may be advantageous, for example, when the layer 46 comprises a conductive material and/or is not present. Alternatively or in addition, the functional layer 56a and/or 56b may comprise the carbon material having the $sp^2$ hybridization, i.e., the functional layers 56a and/or 56b may be at least partially conductive.

The functional layer 56a and/or 56b may comprise a doping material. An average concentration of the doping material may be at least 0.001%, at least 0.002%, at least 0.005% or at least $10^{18}$ per $cm^3$ at a region of the functional layer 56a, 56b respectively. Alternatively or in addition, an average concentration of the doping material may be, for example, at most 15%, at most 12% or at most 10%. The region may refer to a part of the functional region 58 or to the complete layer. An average amount or share of the carbon material and/or of the doping material may vary along the thickness direction 24 of the functional structure 52.

Figure 8B:
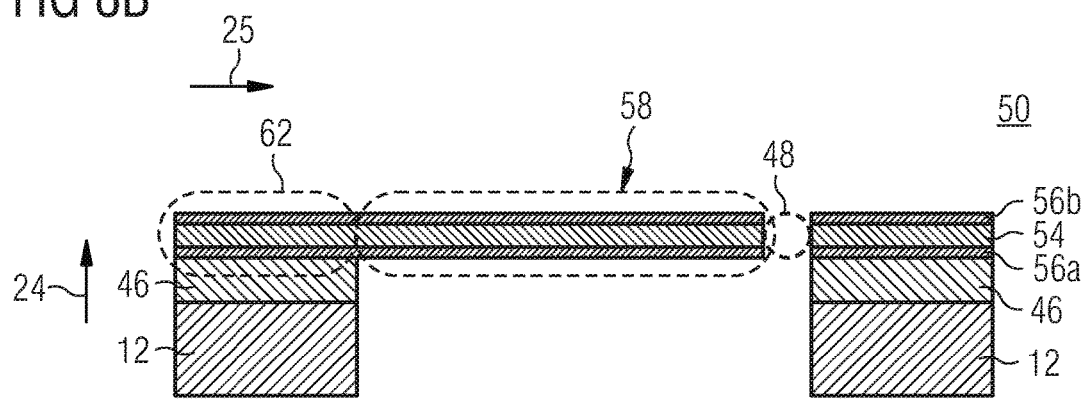
FIG. 8b shows a schematic side view of a micromechanical structure which may be obtained, for example, when removing a portion of the functional structure illustrated in FIG. 8a, according to an embodiment.

FIG. 8b shows a schematic side view of a micromechanical structure 50 which may be obtained, for example, when removing a portion 48 of the functional structure 52 such that the functional region 58 may be used as a bending beam structure. A cantilevered portion 62 may be fixed to the substrate 12 and/or to the layer 46.

An average amount of the carbon material having the $sp^2$ hybridization and/or having the $sp^3$ hybridization may vary along the thickness direction 24 of the functional layers 56a and/or 56b.

Alternatively, the base layer arrangement 54 may comprise a carbon material. The carbon material of the base layer arrangement may comprise the $sp^2$ hybridization. Simplified, the base layer arrangement 54 may be essentially or completely carbon.

When compared to the plot 26c illustrated in FIG. 2, the share between the $sp^2$ hybridization and the $sp^3$ hybridization may vary stepwise along borders between the functional layers 56a, 56b respectively and the base layer arrangement 54 comprising the carbon material.

The layers 56a, 54 and/or 56b may be arranged or generated by subsequent depositing of the materials or layers. The depositing may also include a structurization of the respective layer. The structurization may comprise, for example, a selective etching process.

The carbon material may allow for a high stiffness of the functional structure 52. An extension of the functional structure 52 along the direction 25 perpendicular to the thickness direction 24 may thus be large when compared to the extension along the thickness direction 24. For example, the extension along the direction 25 may be at least one time and at most 1000 times of the extension along the thickness direction 24. Alternatively, the extension along the direction 25 may be at least one time and at most 500 times or at least one time and at most 50 times when compared to the extension along the direction 24. Other embodiments provide functional structures comprising an extension along the direction 25 being larger than 5000 times of the thickness of the functional structure 16 along the thickness direction 24.

In other words, FIGS. 8a and 8b show an application of a carbon thin film in combination with a membrane which may be conductive.

Figure 9A:
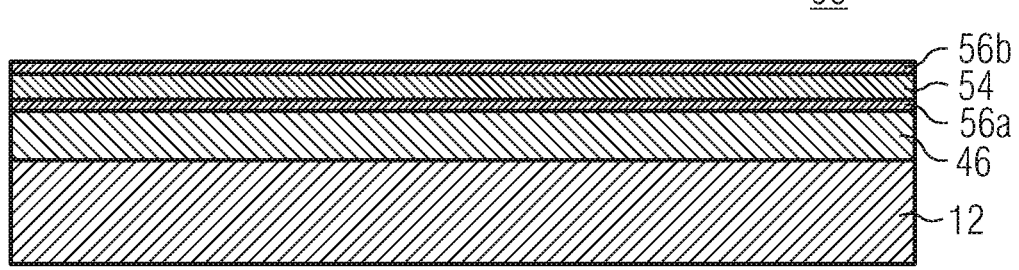
FIG. 9a shows a schematic side view of a stack of layers according to an embodiment.

FIG. 9a shows a schematic side view of a layer arrangement (stack of layers) 90 comprising the substrate 12, the layer 46 and the base layer arrangement 54 sandwiched between the functional layers 56a and 56b. The stack of layers may be processed to obtain the micromechanical structure 40 or 50.

Figure 9B:
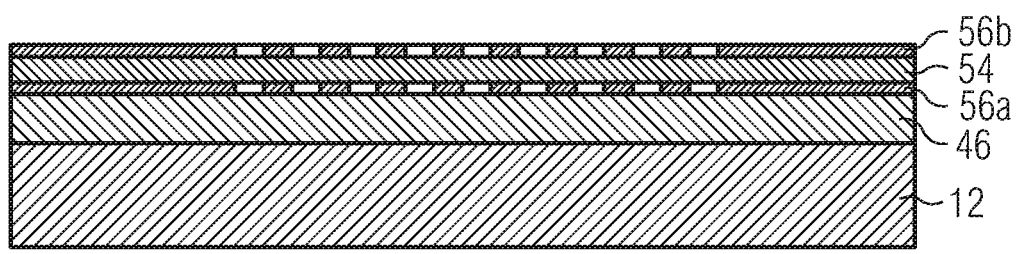
FIG. 9b shows a schematic side view of a stack of layers comprising structured layers, according to an embodiment.

FIG. 9b shows a schematic side view of a stack 90' of layers being different from the stack 90. The functional layers 56a and 56b may be structured, i.e., they may comprise recesses, as will be described later in more detail. The functional layers 56a and/or 56b may be structured, for example, during manufacturing by an etching process for selectively etching recesses into the carbon material of the functional layer 56a, 56b respectively.

Figure 10A:
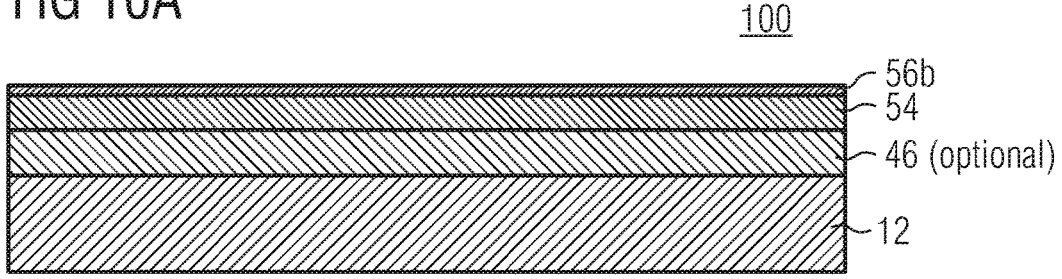
FIG. 10a shows a schematic side view of a stack of layers comprising a different number of layers when compared to the stack illustrated in FIG. 9a, according to an embodiment.

FIG. 10a shows a schematic side view of a stack 100 of layers which is modified when compared to the stack 90 of layers illustrated in FIG. 9a. The base layer arrangement 54 is arranged at the (optional) layer 46, i.e., only one functional layer 56b or 56a is present, while the functional layer 56a or 56b may be ascent and vice versa.

Figure 10B:
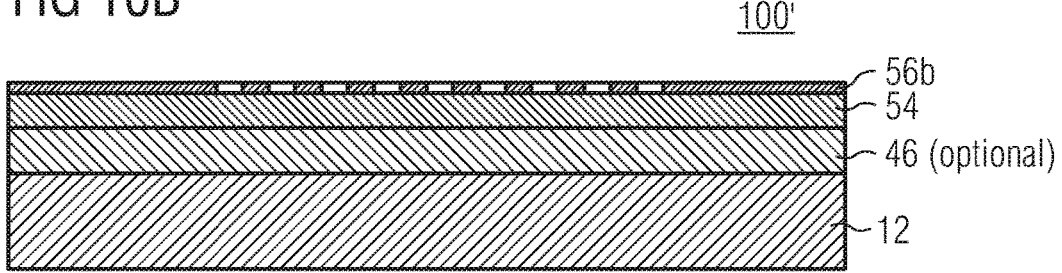
FIG. 10b shows a schematic side view of a further stack of layers comprising a structured layer when compared to the stack of layers illustrated in FIG. 10a, according to an embodiment.

FIG. 10b illustrates a further stack 100' of layers being modified when compared to the stack 100 illustrated in FIG. 10a. The functional layer 56b is structured as was described with respect to the functional layers 56a and 56b in FIG. 9b.

A portion of the substrate 12 and/or of the layer 46 may be removed from a stack of layers illustrated in FIGS. 9a, 9b, 10a and 10b to obtain a micromechanical structure according or relating to the micromechanical structure 40 or 50. Thus, the micromechanical structures 40 and/or 50 may comprise a functional structure comprising only one of the functional layers 56a and 56b.

When referring again to FIGS. 9a, 9b, 10a and 10b, the functional layer 56a may be present, while the functional layer 56b may not be arranged.

The functional layers 56a and/or 56b may be generated by a deposition process such as an chemical vapor deposition process, a physical vapor deposition process and/or an epitaxial growth process. The functional layers 56a and/or 56b may cover the base layer arrangement 54 partially, completely and/or completely with the exception of the recesses of the structure of the functional layers 56a and/or 56b.

Figure 11A:
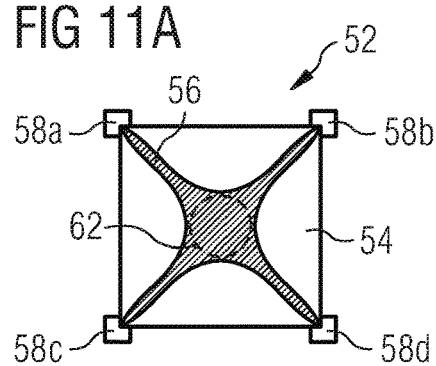
FIGS. 11a-p each show schematic top or bottom views of functional structures according to an embodiment.
Figure 11B:
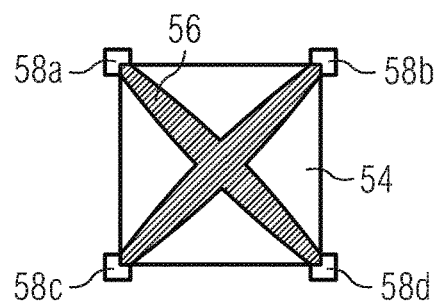
Figure 11C:
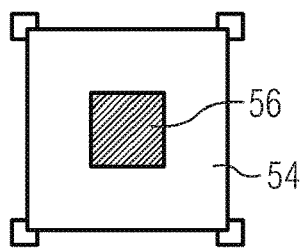
Figure 11D:
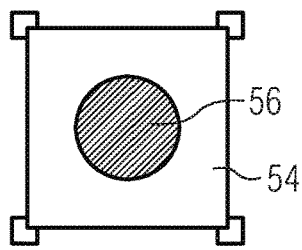
Figure 11E:
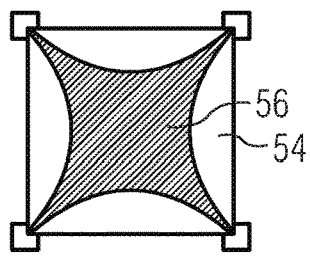
Figure 11F:
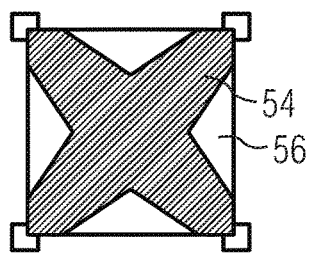
Figure 11G:
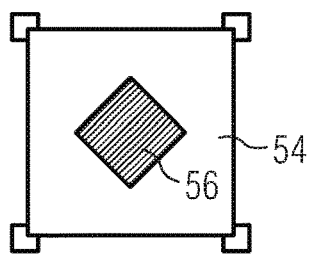
Figure 11H:
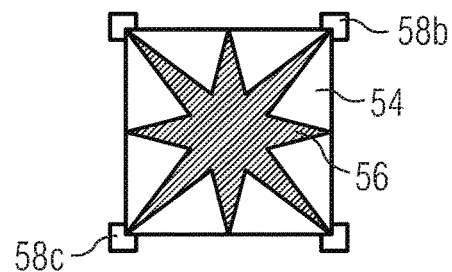
Figure 11I:
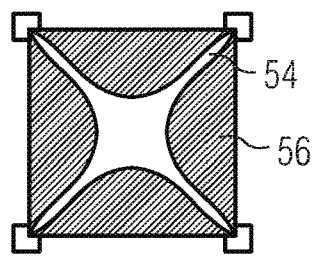
Figure 11J:
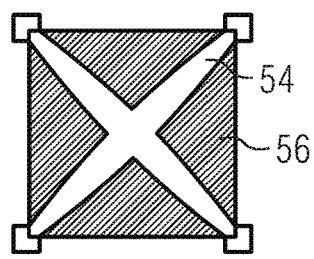
Figure 11K:
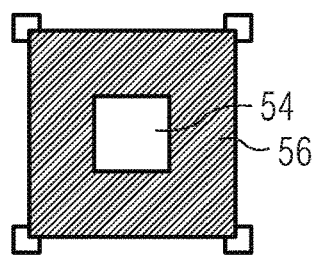
Figure 11L:
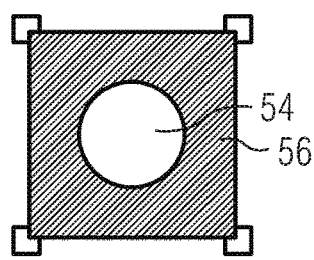
Figure 11M:
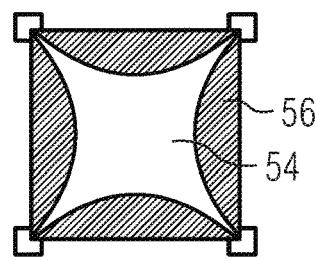
Figure 11N:
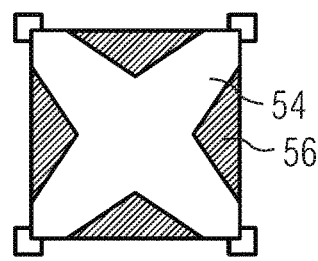
Figure 11O:
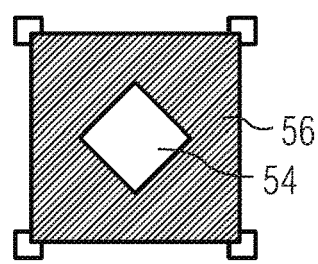
Figure 11P:
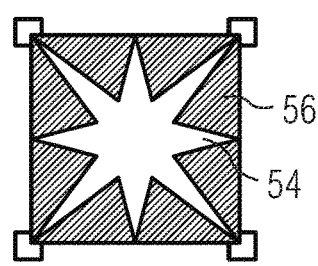

FIGS. 11a-p show schematic top or bottom views of functional structures 52 comprising a quadratic base layer arrangement 54 that is clamped at clamping regions 58a-d.

The functional region 52 may be, for example, a membrane of a sound transducing device, for example, a microphone or a loudspeaker. Although FIGS. 11a-p depict the base layer arrangement 54 being formed quadratic, the base layer arrangement 54 may comprise other shapes, such as a round shape, an elliptical shape, a polygon shape or a combination thereof. For example, the base layer arrangement 54 may be used as a membrane structure wherein the functional layer 56 may be used as enforcing structure, e.g., at a clamped region thereof, at regions configured to impinge large strains during operation and/or at regions where the membrane abuts a stator or an electrode during operation.

With respect to FIG. 11a, the functional layer 56 comprises a shape that may be obtained by an overlay of two elliptical structures being diagonally arranged between the clamping regions 58a and 58d, between the clamping regions 58b and 58c, respectively. In center portions where the two elliptical structures overlap, a circular structure 62 may be arranged. Thus, the shape of the functional layer 56 may be obtained by overlapping two or more geometrical structures or shapes.

With respect to FIG. 11b, a shape of the functional layer 56 may be obtained by overlapping two elliptical structures that are arranged diagonally at the base layer arrangement 54 between two diagonally arranged clamping regions 48a-d, i.e., between the clamping regions 48a and 48d and between the clamping regions 48b and 48c.

With respect to FIG. 11c, the functional layer 56 comprises a shape that is geometrical similar to the shape of the base layer arrangement 54, such that the functional layer 56 is formed quadratic with an edge length smaller than a corresponding edge length of the base layer arrangement 54, wherein the edges of the base layer arrangement 54 and the edges of the functional layer 56 are essentially parallel to each other. The functional layer 56 is arranged at the center of the base layer arrangement 54.

With respect to FIG. 11d, the functional layer 56 comprises a round shape, wherein a center of the functional layer 56 overlaps with a center of the base layer arrangement 54.

With respect to FIG. 11e, the functional layer 56 comprises a shape that may be obtained by sparring shape regions of the base layer arrangement 54 that may be formed by circles or one or more ellipses or parts of them, wherein, for example, a center of a circle or a special point of an ellipse is arranged outside the surface of the base layer arrangement 54.

With respect to FIG. 11f, the functional layer 56 comprises a shape that may be obtained by overlapping two diagonally arranged ellipses, wherein the ellipses comprise an increased conjugate diameter when compared to the ellipsis shown in FIG. 11b. The ellipses are projected only partially into the surface of the base layer arrangement 54 such that the functional layer 56 comprises only parts of the ellipsis.

With respect to FIG. 11g, the functional layer 56 comprises a shape that is geometrically similar to the shape of the base layer arrangement 54, wherein the shape of the functional layer 56 is rotated when compared to FIG. 11c, e.g., it is rotated by an angle of 45°. Alternatively, the functional layer 56 may be rotated by any other angle, such as in a range between 0° and 360°, 0° and 180° or between 0° and 90°.

With respect to FIG. 11h, the functional layer 56 comprises a star shaped surface. The star shape surface may be obtained, for example, by a circular shape and four elliptical shapes that are rotated by an angle, such as 45° to each other, wherein one elliptical shape may be arranged diagonally on the base layer arrangement 54.

With respect to FIG. 11i, the functional layer 56 shows an inversed shape when compared to the functional layer shown in FIG. 11a. Inversed means that regions of the base layer arrangement 54 that are covered in a first shape by the functional layer are spared by the inversed functional layer and vice versa.

With respect to FIG. 11j, the functional layer 56 comprises a shape that is inversed to the shape of the functional layer shown in FIG. 11b.

With respect to FIG. 11k, the functional layer 56 comprises a shape that is inversed when compared to the shape of the functional layer depicted in FIG. 11c.

With respect to FIG. 11l, the functional layer 56 comprises a shape that is inversed to the shape of the functional layer depicted in FIG. 11d.

With respect to FIG. 11m, the functional layer 56 comprises a shape that is inversed to the shape of the functional layer 56 depicted in FIG. 11e.

With respect to FIG. 11n, the functional layer 56 comprises a shape that is inversed to the shape of the functional layer 56 depicted in FIG. 11f.

With respect to FIG. 11o, the functional layer 56 comprises a shape that is inversed to the shape of the functional layer 56 depicted in FIG. 11g.

With respect to FIG. 11p, the functional layer 56 comprises a shape that is inversed to the shape of the functional layer 56 depicted in FIG. 11a.

A base area of the functional layer 56 may comprise at least a part of a circular shape, a star shape, a polygon shape, an elliptical shape, a honeycomb structure, any other shape and/or a combination thereof.

Additionally, the base layer arrangement 54 may comprise other shapes than the illustrated quadratic shape.

FIGS. 12a-i each show a schematic top or bottom view of a possible implementation of the functional region 52. The functional region 52 may comprise exemplarily a base area with a round shape. In the functional region 52 at least one functional layer is arranged at the base layer arrangement 54. The functional region 52, the base layer arrangement 54, respectively, are depicted as having a round circular shape. A round shape may be advantageous when the functional region 52 is at least a part of a deflectable membrane. Alternatively, the functional region 52 and/or the base layer arrangement 54 may comprise a different shape, for example an elliptical shape or a polygon shape. Alternatively, the functional region 52 and/or the base layer arrangement 54 may be formed as a convex or concave formed curve.

Figure 12A:
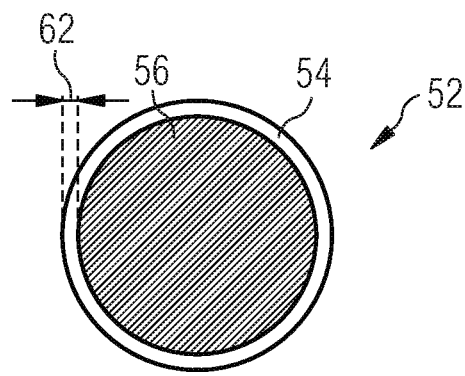
FIGS. 12a-i each show a schematic top or bottom view of a possible implementation of the functional region according to an embodiment.

With respect to FIG. 12a, the functional layer 56 covers the base layer arrangement 54 with the exception of an edge portion 62 of the base layer arrangement 54. For example, a surface of the base layer arrangement 54 covered by the functional layer 56 may be more than 90%, more than 95% or more than 99% or more than 99%.

Figure 12B:
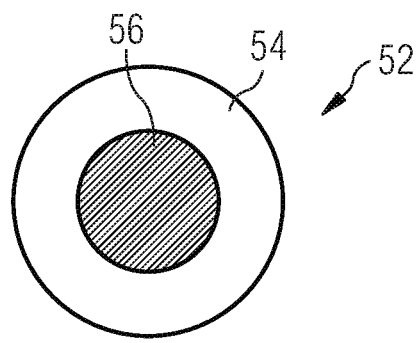

With respect to FIG. 12b, the functional layer 56 may comprise a round shape and may be arranged at a center of the base layer arrangement 54 such that the functional layer 56 is arranged concentric with respect to the base layer arrangement 54. A diameter of the functional layer 56 may be, for example, at least 1%, at least 20% or at least 50% of a diameter of the base layer arrangement 54, wherein the diameter may also refer to a longest and/or shortest extension of the base area of the base layer arrangement 54 when the same comprises a non-circular shape.

Figure 12C:
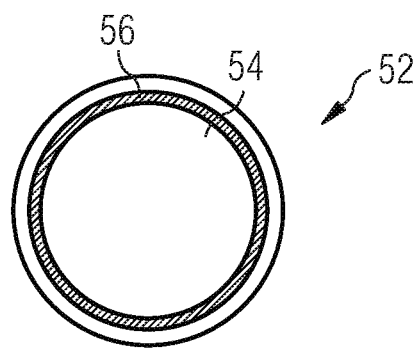

With respect to FIG. 12c, the functional layer 56 comprises a ring shape that is arranged concentrically with respect to a base area of the base layer arrangement 54. Alternatively, a center of the functional layer 56 may be arranged at a different position of the base layer arrangement 54, such that the functional layer 56 is not concentric with respect to the center of the base layer arrangement 54.

With respect to FIG. 12*b*, the functional layer 56 may comprise a honeycomb structure comprising a plurality of honeycombs. The honeycomb structure may totally cover the base layer arrangement 54, wherein according to alternative embodiments it may cover the base layer arrangement 54 only partially. An inner region of one, more, or all of the honeycombs may be formed as a recess 64 such that the base layer arrangement 54 may be uncovered by the functional layer 56 at the recesses 34. The recesses 34 may have a polygon shape such as a hexagon shape.

A honeycomb formed functional layer 56 may lead to a high stiffness of the functional region 52 as honeycomb structures may provide a high robustness against excited forces.

Figure 12D:
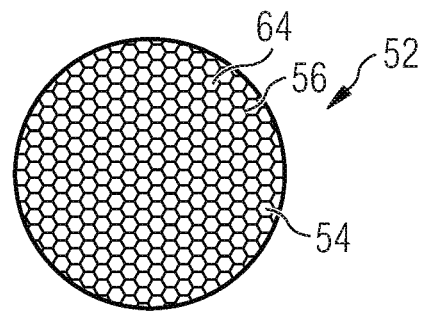
Figure 12E:
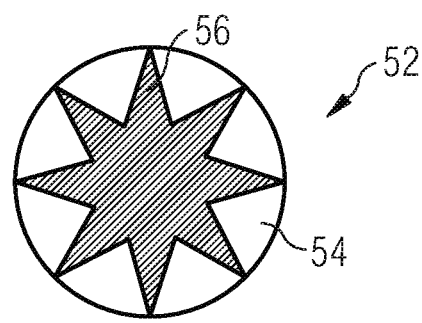

With respect to FIG. 12*e*, the functional layer 56 may comprise a star shape extending from the center to an outer circumference of the base layer arrangement 54. For example, the functional region 52 may be clamped or mounted to the substrate at ends (beams or rays) of the star shape or at regions of the base layer arrangement 54 that are between the ends of the star shape.

Figure 12F:
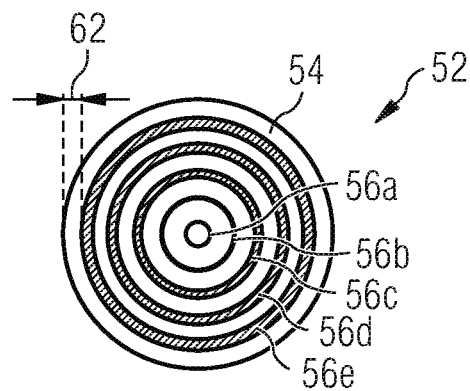

With respect to FIG. 12*f*, the base layer arrangement 54 may be partially covered by a plurality of functional layers 56*a*-*e*. Each of the functional layers 56*a*-*e* may be formed as a ring structure comprising a diameter, a broadness of the respective ring and a radius different from each other and may be arranged concentrically with respect to each other and to the center of the base layer arrangement 54. Thus, the functional layers 56*a*-*e* form a multi-ring structure. Alternatively, one or more rings may comprise an equal broadness. Although the functional layers 56*a*-*e* are described as being different layers, they may be obtained by structuring one layer being generated or arranged at the base layer arrangement 54, for example, by a selective etching process.

Figure 12G:
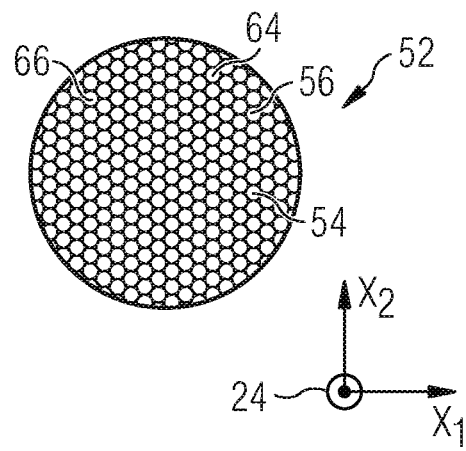

With respect to FIG. 12*g*, the functional layer 56 may be formed similar to the functional layer shown in FIG. 12*d* with the exception that the recesses 34 may be formed as circles. This may lead to a varying extent of the material of the functional layer 56 along the first and/or a second lateral direction X1 and/or X2 arranged perpendicular to the thickness direction 24. At connection points 66 between two or more recesses 64 the extent along the first lateral direction X1 and/or the second lateral direction X2 may be higher, resulting in a higher amount of material of the functional layer 56 at those points. This may lead to a higher stability of the functional layer 56.

Figure 12H:
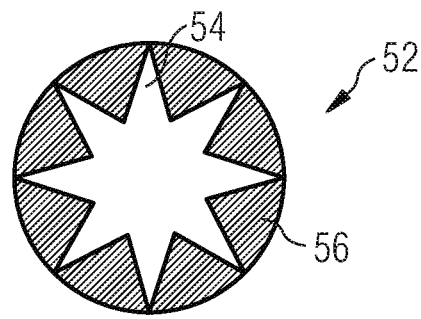

With respect to FIG. 12*h*, the functional layer 56 may comprise an inverse star shape when compared to the star shape depicted in FIG. 12*e*. The functional layer 56 may partially cover or encapsulate the base layer arrangement 54, sparing an inner star-shaped region.

Although the star shapes shown in FIGS. 12*e* and 12*h* are depicted as extending from the center of the base layer 54 to the outer region, the star shapes may alternatively only extend to a value of less than 50%, less than 75% or less than 95% of the radius or extend along the first and/or second lateral direction X1 and/or X2 of the base layer arrangement 54.

Figure 12I:
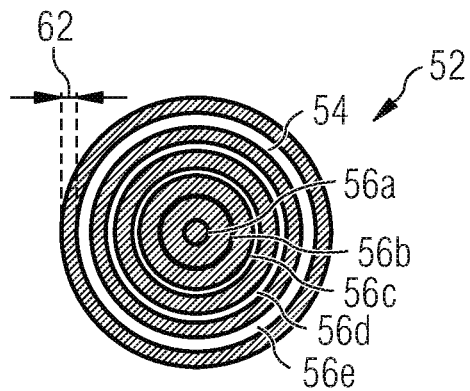

With respect to FIG. 12*i*, the functional layers 56*a*-*e* are arranged at an inverse multi-ring shape at the base layer arrangement 54 when compared to the functional layers 56*a*-*e* depicted in FIG. 12*f*. When compared to the functional layers 56*a*-*e* shown in FIG. 12*f*, the functional layers 56*a*-*e* shown in FIG. 12*i* may be arranged such that the outer region 62 and the center of the base layer arrangement 54 are covered by the functional layers 56*a*-*e*, wherein in FIG. 12*f*, a comparable outer region 62 and the center are spared by the functional layers 56*a*-*e*.

The functional structure 52 may be a membrane structure. The micromechanical structure 40 and/or 50 may be part of a sound transducer structure.

In other words, FIGS. 11*a*-*p* and 12*a*-*i* provide a compact overview of possible realizations of layers or stacks, wherein the illustrations may be combined without any limitations. Based on a type of a process for depositing the carbon layer and based on a structure of the stack different dependencies may be obtained with respect to the physical properties. Depending on whether the membrane is operated above, in the center of or below a counter-electrode arranged at a backplate for example, different characteristics regarding pressure and stability may be achieved. The possibility to modify characteristics of the system after depositing may allow for a further degree of freedom when compared to existing material layers which, up to now, could only be controlled by implantation and the temperature budged.

These advantageous properties of a possible stiffening and the further degree of freedom may especially be used when arranging large membranes with diameters larger than 1 mm such as analog loudspeakers which may use membranes having diameters between 4 mm and 8 mm. Alternatively or in addition, an improvement of properties of digital MEMS loudspeakers (jumping jack principle) may be achieved.

Figure 13A:
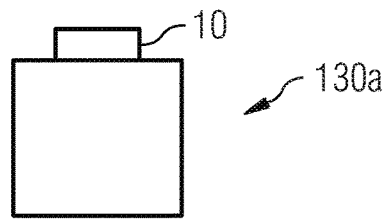
FIG. 13a shows a schematic block diagram of a micromechanical sound transducer according to an embodiment.

FIG. 13*a* shows a schematic block diagram of a micromechanical sound transducer 130*a*. The micromechanical sound transducer 130*a* comprises the micromechanical structure 10. The micromechanical sound transducer 140*a* may be configured to sense variation in an ambient pressure, such as a sound pressure level. The variations in the sound pressure level may enable the functional region of the micromechanical structure 10 to deflect. Thus, the functional region may be deflectable responsive to the sound pressure level. For example, an electrostatic field may be arranged between the functional region and the substrate or a backplate electrode arranged at the micromechanical structure 10. A deflection of the functional region may lead to a varying charge and/or voltage sensible or detectable between the function region and the substrate, the backplate electrode respectively.

Alternatively, the micromechanical sound transducer 130*a* may be configured to apply a force at the functional region, for example, by applying an electrostatic or electrodynamic field, such that the functional region deflects based on the electrostatic or electrodynamic field such that sound may be emitted by the micromechanical sound transducer 130*a*. The micromechanical sound transducer 130*a* may thus be configured to operate as a microphone or as a loudspeaker.

Alternatively or in addition, the micromechanical sound transducer may comprise a micromechanical structure 20' or 20".

Figure 13B:
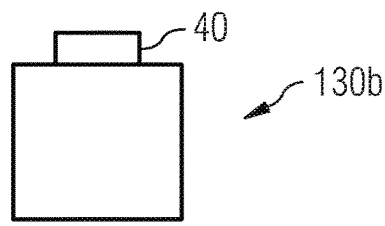
FIG. 13b shows a schematic block diagram of a further micromechanical sound transducer according to an embodiment.

FIG. 13*b* shows a schematic block diagram of a micromechanical sound transducer 130*b*, wherein the micromechanical sound transducer 130*b* comprises the micromechanical structure 40. The micromechanical structure 40 may be configured as it is described for the micromechanical structure 10 in FIG. 13*a* such that the micromechanical sound transducer 130*b* may be configured to operate as a microphone or as a loudspeaker.

Alternatively or in addition, the micromechanical sound transducer 130b may comprise the micromechanical structure 50.

In the following, reference will be made to details of generating the carbon layer arrangement and/or the functional layer. The carbon layer arrangement and/or the functional layer may comprise the carbon material having an $sp^2$ and/or the $sp^3$ hybridization. Carbon-based layers distinguish themselves by a large variety of a possible mechanical and electrical properties which are implemented. One reason is a possible hybridization of a carbon atom and a portion of hydrogen provided during a process of generating the carbon layer, i.e., during depositing the carbon material of the carbon layer arrangement and/or of the functional layer.

In other words, embodiments described herein use advantages of carbon thin films used in micromechanical systems or in microelectromechanical systems. An allover or at least partial coverage of MMS or MEMS structure elements such as bending beams or membranes allows for an increase of resistivity and stability of detached or exposed structures like the membranes or the bending beams. In addition, an enhancement of anti-sticking properties may be achieved. The enhancement of anti-sticking properties may be obtained based on a lower wettability of the described carbon layers, e.g., by doping the carbon material using a doping material such as fluorine doped or terminated carbon layers. This allows for different, new and simple structures which may be obtained with a lower amount or even without protective coatings such as silicon nitrite (SNit) or intermediate oxide layers.

A coating of a structure on one side or at both sides using a carbon layer as described with respect to the functional layer allows for passivating the structure. In addition, based on a specific adding or insertion of doping materials such as nitrogen (N), an optimized conductivity may be obtained and electric and mechanical properties of the layer such as tensions may be adjusted.

Embodiments provide carbon-based membranes or bending beams as well as a possibility to coat membranes comprising doped silicon or doped polysilicon partially or completely to adjust or optimize the properties of the membranes or bending beams.

In known poly-Si membranes as used for MEMS elements, in particular in D-sound devices, decisive trials of stability, such as drop and pressure tests are usual. A known Si microphone may have a limit at a pressure difference of roughly two bar. Increased robustness may allow for, on the one hand, increasing the stressabilty—with a constant membrane thickness—and, on the other hand, reducing the membrane thickness, and thus the vibrating mass in the device, which may result in an improvement in response and additionally in an increase of the SNR.

Known polysilicon layers may comprise a thickness of, for example, between 330 nm to 2 μm and may comprise special designs trying to improve stressability effects of the membrane structures. When compared to such known membranes whose electrical properties may be controlled by an implantation dose and/or temperature during a process for generating the same. Embodiments additionally provide a possibility to use properties of tempering of the additional carbon layers for controlling the electric properties.

Thin films comprising a amorphic carbon may be very robust, may resist high strains and may be adapted or optimized in a large variety to a respective application. Based on a respective process for generating the carbon layer, a desired conductivity of a component (for example, a condenser microphone) may be adjusted intrinsically during deposition (e.g., based on a mixing of a processed gas comprising nitrogen such as $N_2$ or $NH_3$) or after deposition. After deposition, for example, an implantation process for implanting nitrogen and/or a subsequent annealing process may be used. This may allow for membranes which are mechanically very robust. Based on a chemical vapor deposition (CVD) a specific mixing of nitrogen to a mixture of processed gases is possible.

The mixture of processed gases may comprise one or more gases comprising carbon. The process allows for adjusting a share of hydrogen such that a $sp^2/sp^3$ ratio may be adjusted or optimized in the carbon layer. In particular, a selection of one or more gases comprising carbon such as $CH_4$, $C_2$, $H_2$, . . . may allow for adjusting a microstructure of the generated layer. A plasma enhanced CVD (PE-CVD) process may allow for a fast change of the mixture of process gases without stopping or interrupting the plasma. For example, this may allow for generating a poly-Si/a-Si:C:H/a-C:NH//a-C:H//a-C:H:F sandwich membrane. This may be understood in terms of a functionality being conductivity//stiffness//conductivity//adjustment of stress and Young's modulus (tuning layer)//anti-sticking, wherein (as non-limiting example only) Si may symbolize a silicon material, C may symbolize a carbon material, a-C may symbolize an amorphous carbon material, N may symbolize a nitrogen material, H may symbolize an hydrogen material and F may symbolize a fluorine material.

A further advantage for MEMS components may be seen in the behavior of carbon layers during a subsequent tempering. Amorphous carbon (a-C:M:H) layers may be adjusted for being highly conductive (low-ohmic) based on the tempering.

Some embodiments provide a possibility for cover or encapsulate known membranes such as membranes comprising doped polysilicon. An advantage is that a considerable increase of the mechanical loadability may be obtained and/or that a thickness of the membrane may be reduced.

A further advantage may be, that based on the carbon material the wettability may be reduced when compared to pure silicon. This may allow for reducing sticking of a component during release-etching and during operation.

The obtained high robustness may allow for an increase of a loadability while maintaining a thickness of the membrane and/or for reducing the membrane thickness and therefor the oscillating mass in the component, which may allow for improving response characteristics of the component and/or for an increase of the SNR.

One aspect of the embodiments described herein is an application of carbon layers or layer systems based on carbon layers at micro-technically generated structures. The application may refer to covering a layer partially or completely. The application may allow for adjusting and/or improving electrical and/or mechanical properties. The adjustment of a share of $sp^3$ and $sp^2$ hybridization may allow for utilizing a further degree of freedom during adjusting the properties of a membrane or a bending beam.

Figure 14:
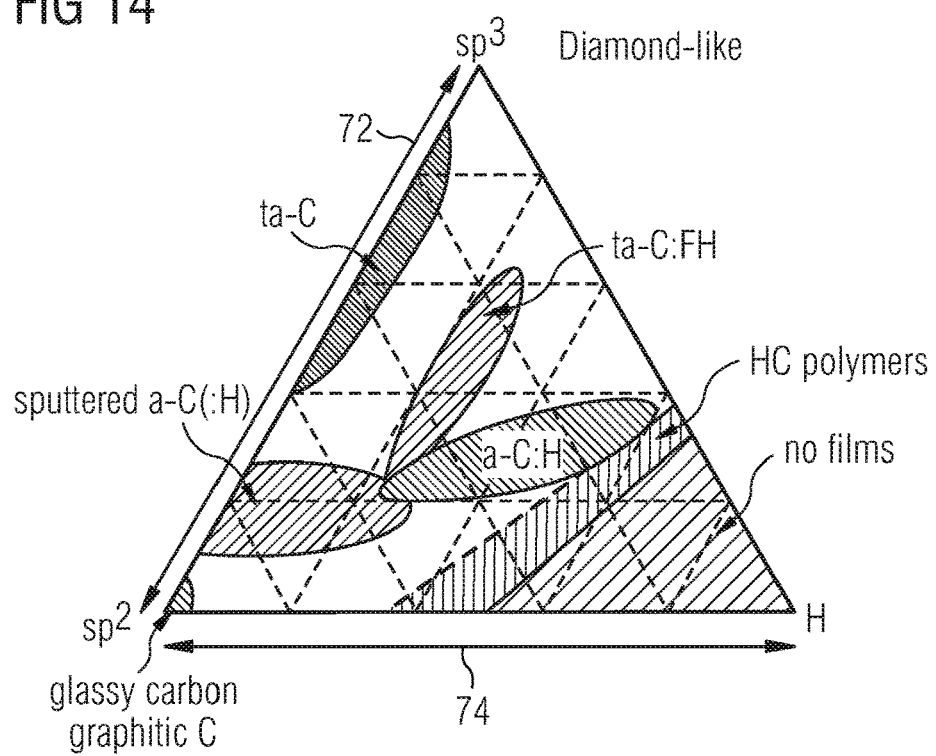
FIG. 14 illustrates the ternary phase diagram of carbon-hydrogen.

FIG. 14 illustrates a known ternary phase diagram of carbon-hydrogen. A first parameter 72 may describe the ratio between the $sp^2$ and $sp^3$ hybridization of the carbon material. An increase of the $sp^3$ hybridization may allow for a higher stiffness and/or a reduced conductivity of the material. The parameter 72 may be combined with a second parameter 74 describing an amount of hydrogen being arranged in the carbon material. The combination of the parameters 72 and 74 allow for obtaining the different materials and different material characteristics.

In other words, FIG. 14 illustrates a ternary phase diagram of carbon-hydrogen which depicts a bandwidth of physical, chemical and/or electrical properties based on different hybridizations.

FIG. 15 illustrates a schematic flowchart of a method 1500 for fabricating a micromechanical structure such as the micromechanical structure 10, 20' or 20". A step 1510 comprises providing a substrate. A step 1520 comprises arranging a functional structure at the substrate such that a functional region of the functional structure is deflectable with respect to the substrate responsive to a force acting on the functional region, wherein the functional structure comprises a carbon layer arrangement, wherein a basis material of the carbon layer arrangement is a carbon material.

FIG. 16 illustrates a schematic flowchart of a method 1600 which may be used, for example, during arranging the functional structure in the step 1520.

In a step 1610, a set of parameters of the deposition process is used to obtain the carbon material with a first ratio between the $sp^2$ hybridization and the $sp^3$ hybridization of the carbon material. The deposition process may be, for example, a chemical vapor deposition process, a plasma-enhanced chemical vapor deposition process, a physical vapor deposition process, a sputtering process such as a reactive sputtering.

A step 1620 comprises changing a parameter of the set of parameters to obtain a modified set of parameters, wherein the modified set of parameters is used for the deposition process to obtain the carbon material with a second ratio between the $sp^2$ hybridization and the $sp^3$ hybridization of the carbon material such that an average amount of the $sp^2$ hybridization or the $sp^3$ hybridization varies along a thickness direction of the functional structure.

The deposition process used for depositing the functional structure may be influenced by the set of parameters. The set of parameters may comprise one or more of a processed temperature, a process pressure, a composition of a process gas, a distance between electrodes for generating an electrical field for accelerating electrons and/or ions of a plasma and an electrical power used for accelerating the electrons and/or ions of the plasma.

Carbon deposition may be divided in a kinetically controlled deposition and a chemical controlled deposition. In particular, the kinetical deposition may be applied for PE-CVD processes at low pressure in the sputter region and for PVD processes (low pressure and low temperature). A low pressure may be, for example, in a range from at least 1 mTorr and at most 100 mTorr. In addition, this concept may be applied for ion beam methods, filtered cathodic vacuum arc and related deposition techniques. Even, the process gas mixture and the carbon containing gas may play a role for these techniques, the relation between carbon containing gas and subsequent film hybridization may be more pronounced for the PE-CVD at elevated deposition temperatures and high pressure.

For example, for the kinetically controlled deposition techniques, deposition temperatures higher than approximately 150° C. may result in films with elevated $sp^2$ hybridization content. Looking on an amount of energy that may be regarded as ideal for highest possible $sp^3$ content, an energy of 100 eV/C+ may be used for kinetically controlled deposition at temperatures below 150° C.

For PE-CVD at elevated temperatures, those high-deposition temperatures may (in addition with an adequate carbon gas choice) to deposit films (carbon layers) with a high density and a high content of $sp^3$ hybridization. An application of one or more unchanged process parameters at a pressure of 8 Torr and a temperature of more than 150° C., such as more than 250° C. or more than 350° C. such as 400° C. may result in a highly compressive stressed a-C:H film with a high portion of $sp^3$ hybridization when using, for example, $CH_4$ as process gas. In contrast, when using, for example, $C_2H_2$ may result in a low-stressed film with a structure dominated by a carbon material having the $sp^2$ hybridization. Thus, a change or a modification of the process gas may allow for changing, adapting or modifying the ratio between the $sp^2$ hybridization and the $sp^3$ hybridization.

For example, a process gas comprising an increased amount of hydrogen when compared to an amount of carbon ($CH_4$ may comprise a ratio of 4/1, $C_2H_2$ may comprise a ratio of 1/1) may allow for obtaining a high ratio of the carbon material comprising the $sp^3$ hybridization. Simplified, a high hydrogen/carbon ratio of 4/1 may result in highly $sp^3$ coordinated films. Using acetylene (H/C is 1/1) may result in soft films which are $sp^2$ coordinated. Thus, the chemistry may play an important role or the most important role at temperatures and pressure, for example, in a region between 1 Torr and 10 Torr, such as about 8 Torr, during (PE-)CVD in capacitive coupled plasma reactors.

Such an effect may be achieved by either chemistry of the used precursor (process gas) or by selective etching of $sp^2$ coordinated carbon by reactive hydrogen which may be active at higher deposition temperatures.

Alternatively or in addition, a hydrogen dominated process gas (for example, pure hydrogen) may be used. At an elevated deposition temperature as explained above and/or at high pressures during the PE-CVD the hydrogen dominated process is may allow for increasing the amount of carbon material having the $sp^3$ hybridization as described for $CH_4$. This may be obtained by using an hydrogen-based etching of the soft $sp^2$ hybridization during generating the $sp^2$ and $sp^3$ hybridization. Simplified, instead of using a process gas comprising a large amount of hydrogen joint to carbon, the hydrogen material may also be inserted as an additional gas. For example, adding hydrogen may allow for selectively etching the carbon material having the $sp^2$ hybridization and therefore up-concentration of the carbon material having the $sp^3$ hybridization in the resulting film.

A variation of the process temperature may allow for increasing a relative concentration of the carbon material having the $sp^2$ hybridization with increasing temperature. By increasing a pressure of the process gas, a higher amount of carbon material and/or hydrogen material is present which may result in a higher share of the carbon material having the $sp^3$ hybridization, while, at the same time, influencing performance of the plasma generator being influenced by a distance between the cathode and the anode and/or by an electrical power used for accelerating the electrons and/or ions of the plasma using the cathode and the anode. Thus, also the distance between the electrodes (cathode and anode) of the plasma generator and/or the electrical power used for accelerating the electrons and/or ions of the plasma may be varied dependently or independently from other parameters. For example, while not changing other parameters, a reduced distance between the electrodes and/or an increased power used for accelerating the electrons and/or ions may result in an higher amount of the carbon material having the $sp^3$ hybridization, for example, when the pressure is in a range between 1 and 10 Torr. A pulse energy of a pulse may be influenced, for example, by a frequency of pulses and/or by a magnitude of a pulse. Pulses may be used, for example, in a pulsed sputtering process. A pulse width (duration) may be, for example, in a range of at least 10 μs and at most 200

μs. The magnitude of the pulse (magnitude of the pulse) may be, for example, in a megawatt range.

An energy of app. 100 eV per carbon atom (or ion) to be accelerated or deposited may result in a maximum share of carbon material having the $sp^3$ hybridization. An increase or decrease of energy may result in an increase of an amount of carbon material having the $sp^2$ hybridization while decreasing an amount of material having the $sp^3$ hybridization.

The deposition process may comprise, for example, a chemical vapor deposition process, a plasma-enhanced chemical vapor deposition process, a physical vapor deposition process, a sputtering process such as a reactive sputtering. A precursor may be, for example, a gas comprising a carbon material and/or a hydrogen material. Alternatively, the process gas may also comprise a metal material, wherein a further process gas comprising the carbon material may be additionally used as process gas or precursor.

An intrinsic stress of the deposited carbon material may increase with an increasing share of the carbon material having the $sp^3$ hybridization. Other process gases may be used, the other process gases comprising the carbon material and the hydrogen material. For example, Ethene ($C_2H_4$) may be used comprising a carbon/hydrogen ratio of 1/2.

Figure 17:
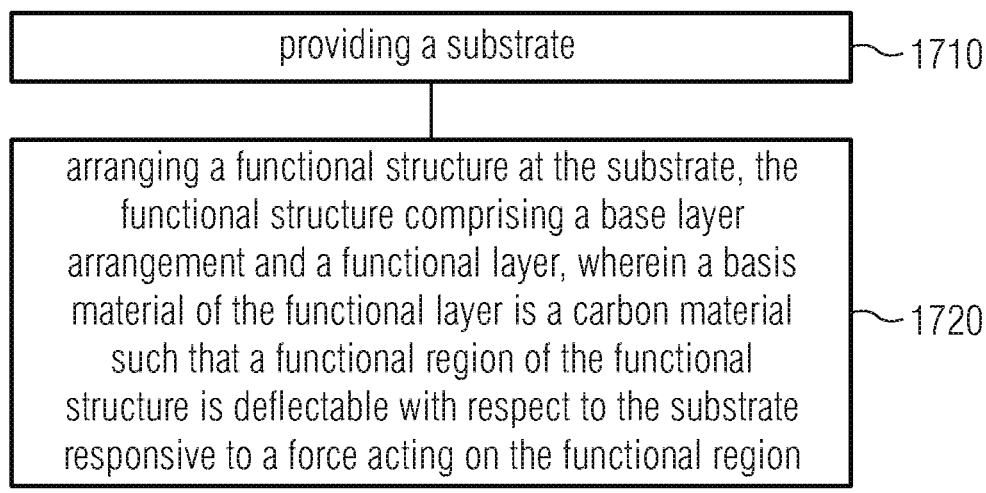
FIG. 17 schematically illustrates a flow chart of a further method for fabricating a micromechanical structure, according to an embodiment.

FIG. 17 schematically illustrates a flow chart of a method 1700 for fabricating a micromechanical structure such as the micromechanical structure 40 or 50. A step 1710 comprises providing a substrate. A step 1720 comprises arranging a functional structure at the substrate. The functional structure comprising a base layer arrangement and a functional layer, wherein a basis material of the functional layer is a carbon material such that a functional region of the functional structure is deflectable with respect to the substrate responsive to a force acting on the functional region.

Figure 18:
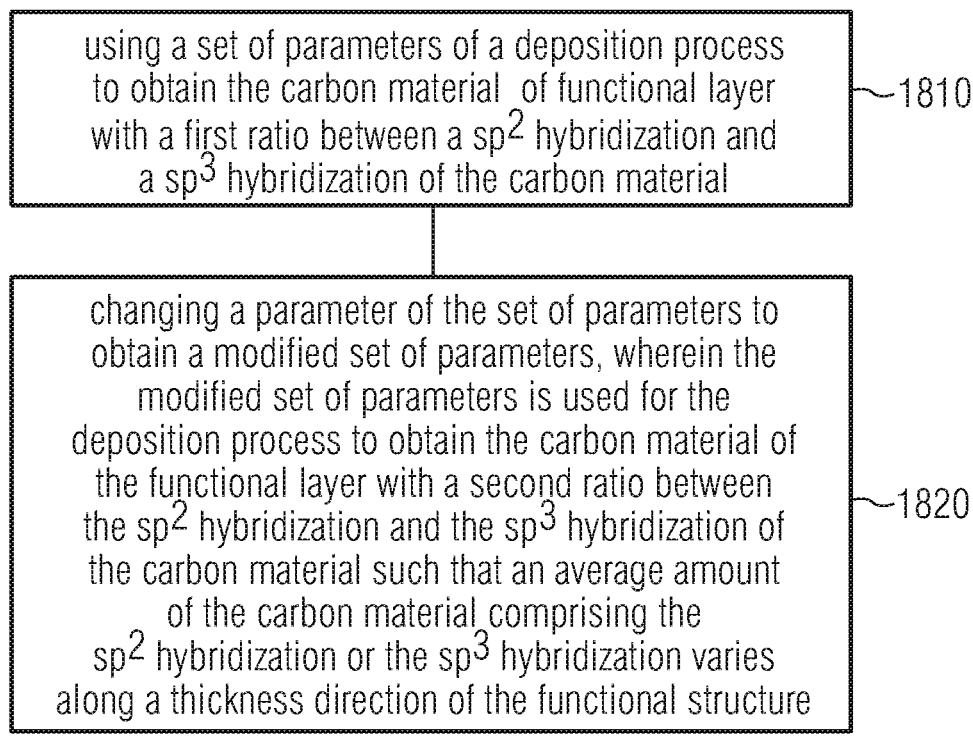
FIG. 18 illustrates a schematic flowchart of a method which may be used during a step of the method illustrated in FIG. 17, according to an embodiment.

FIG. 18 schematically illustrates a flowchart of a method 1800 which may be used for arranging the functional structure in step 1720.

A step 1810 comprises using a set of parameters of the deposition process to obtain the carbon material of the functional layer with a first ratio between an $sp^2$ hybridization and an $sp^3$ hybridization of the carbon material.

The deposition process may comprise a chemical vapor deposition process, a plasma-enhanced chemical vapor deposition process, a physical vapor deposition process, a sputtering process such as a reactive sputtering. A precursor may be, for example, a gas comprising a carbon material and/or a hydrogen material. Alternatively, the process gas may also comprise a metal material, wherein a further process gas comprising the carbon material may be additionally used as process gas or precursor.

A step 1820 comprises changing a parameter of the set of parameters to obtain a modified set of parameters, wherein the modified set of parameters is used for the deposition process to obtain the carbon material of the functional layer with a second ratio between the $sp^2$ hybridization and the $sp^3$ hybridization of the carbon material such that an average amount of the carbon material comprising the $sp^2$ hybridization or the $sp^3$ hybridization varies along a thickness direction of the functional structure.

The set of parameters of a method 1800 may be the set of parameters described with respect to FIG. 16.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A micromechanical structure comprising:
a substrate; and
a functional structure arranged at the substrate;
wherein the functional structure comprises a functional region which is deflectable with respect to the substrate responsive to a force acting on the functional region;
wherein the functional structure comprises a carbon layer arrangement comprising a layer, wherein a basis material of the layer of the carbon layer arrangement is a carbon material;
wherein an average amount of the carbon material within the carbon layer material varies within the layer of the carbon layer arrangement along a thickness direction of the functional structure; and
wherein the carbon material is doped with a dopant of at least one material, and wherein the average amount of the carbon material varies along the thickness direction based on a varying degree of doping of the carbon material with the dopant of the at least one material along the thickness direction, wherein the dopant is a metal, a transition metal and/or a metalloid comprising silicon.

2. The micromechanical structure according to claim 1, wherein an average amount of the carbon material in the layer of the carbon layer arrangement is at least 90% at a region of the carbon layer arrangement.

3. The micromechanical structure according to claim 1, wherein the carbon material of the carbon layer arrangement comprises a first portion and a second portion, the first portion having an $sp^2$ hybridization and the second portion having an $sp^3$ hybridization, wherein an average amount of the first portion or of the second portion varies within the layer of the carbon layer arrangement along a thickness direction of the functional structure.

4. The micromechanical structure according to claim 1, wherein the layer of the carbon layer arrangement comprises a doping material of the carbon material, wherein an average concentration of the doping material is at least 0.001% at a region of the carbon layer arrangement.

5. The micromechanical structure according to claim 1, wherein a base area of the layer of the carbon layer arrangement comprises at least a part of a circular shape, a ring shape, a star shape, a polygon shape, an elliptical shape, a honeycomb structured shape or a combination thereof.

6. The micromechanical structure according to claim 1, wherein the functional structure is a membrane structure and wherein the micromechanical structure is a part of a sound transducer structure.

7. The micromechanical structure according to claim 1, wherein the functional structure is a bending beam structure comprising a cantilevered portion and the deflectable functional region.

8. The micromechanical structure according to claim 1, wherein a lateral extension of the functional structure along a lateral direction perpendicular to a thickness direction is at least 50 times greater than a thickness of the functional structure along the thickness direction.

9. A micromechanical sound transducer comprising the micromechanical structure according to claim 1.

10. The micromechanical structure according to claim 1, wherein an average concentration of the at least one material is at least 1018 per cm3 at a region of the carbon layer arrangement.

11. The micromechanical structure according to claim 4, wherein the doping material is one of a metal material, a nitrogen material, a fluorine material, and a phosphorus material.

12. The micromechanical sound transducer according to claim 9, wherein the micromechanical sound transducer is a microphone.

13. The micromechanical sound transducer according to claim 9, wherein the micromechanical sound transducer is a loudspeaker.

14. A micromechanical structure comprising:
a substrate; and
a functional structure arranged at the substrate;
wherein the functional structure comprises a functional region which is deflectable with respect to the substrate responsive to a force acting on the functional region;
wherein the functional structure comprises a base layer arrangement and a functional layer;
wherein a basis material of the functional layer is a carbon material;
wherein an average amount of the carbon material within the functional layer varies along a thickness direction of the functional structure; and
wherein the carbon material is doped with a dopant of at least one material, and wherein the average amount of the carbon material varies along the thickness direction based on a varying degree of doping of the carbon material with the dopant of the at least one material along the thickness direction, wherein the dopant is a metal, a transition metal and/or a metalloid comprising silicon.

15. The micromechanical structure according to claim 14, wherein the base layer arrangement is a conductive base layer arrangement.

16. The micromechanical structure according to claim 14, wherein an average amount of the carbon material in the functional layer is at least 90% at a region of the functional layer.

17. The micromechanical structure according to claim 14, wherein the functional layer comprises a doping material of the carbon material, wherein an average concentration of the doping material is at least 0.001% at a region of the functional layer.

18. The micromechanical structure according to claim 14, wherein the functional structure is a membrane structure and wherein the micromechanical structure is part of a sound transducer structure.

19. The micromechanical structure according to claim 14, wherein the functional structure is a bending beam structure comprising a cantilevered portion and the deflectable functional region.

20. The micromechanical structure according to claim 14, wherein a first portion of the carbon material comprises an $sp^3$ hybridization.

21. The micromechanical structure according to claim 14, wherein a second portion of the carbon material comprises an $sp^2$ hybridization.

22. A micromechanical sound transducer comprising a micromechanical structure according to claim 14.

23. The micromechanical structure according to claim 17, wherein the doping material is one of a metal material, a nitrogen material, a fluorine material, and a phosphorus material.

24. The micromechanical structure according to claim 20, wherein the first portion is at least 30% of the carbon material.

25. The micromechanical structure according to claim 20, wherein an average amount of the carbon material comprising the $sp^3$ hybridization varies along a thickness direction of the functional structure.

26. The micromechanical structure according to claim 20, wherein an average amount of the carbon material comprising the $sp^2$ hybridization varies along a thickness direction of the functional structure.

27. The micromechanical structure according to claim 20, wherein the carbon material essentially comprises an $sp^3$ hybridization and wherein the base layer arrangement comprises a basis material being carbon essentially comprising an $sp^2$ hybridization.

28. The micromechanical structure according to claim 21, wherein the second portion is at least 30% of the carbon material.

29. The micromechanical sound transducer according to claim 22, wherein the micromechanical sound transducer is a microphone.

30. The micromechanical sound transducer according to claim 22, wherein the micromechanical sound transducer is a loudspeaker.

31. The micromechanical structure according to claim 23, wherein a base area of the functional layer comprises at least a part of a circular shape, a ring shape, a star shape, a polygon shape, an elliptical shape, a honeycomb structured shape or a combination thereof.

32. A micromechanical structure comprising:
a substrate; and
a functional structure arranged at the substrate,
wherein the functional structure comprises a functional region which is deflectable with respect to the substrate responsive to a force acting on the functional region,
wherein the functional structure comprises a carbon layer arrangement comprising a layer, wherein a basis material of the layer of the carbon layer arrangement is a carbon material,
wherein the carbon material of the carbon layer arrangement comprises a first portion and a second portion, the first portion having an $sp^2$ hybridization and the second portion having an $sp^3$ hybridization, wherein an average amount of the first portion or of the second portion varies within the layer of the carbon layer arrangement along a thickness direction of the functional structure,
wherein an average amount of the carbon material within the carbon layer material varies within the layer of the carbon layer arrangement along a thickness direction of the functional structure; and
wherein the carbon material is doped with a dopant of at least one material, and wherein the average amount of the carbon material varies along the thickness direction based on a varying degree of doping of the carbon material with the dopant of at least one material along the thickness direction, wherein the dopant is a metal, a transition metal and/or a metalloid comprising silicon.

33. A micromechanical structure comprising:
a substrate; and
a functional structure arranged at the substrate, wherein the functional structure comprises a functional region which is deflectable with respect to the substrate responsive to a force acting on the functional region, wherein the functional structure comprises a base layer arrangement and a functional layer, wherein a basis material of the functional layer is a carbon material, wherein a first portion of the carbon material comprises an $sp^3$ hybridization, wherein an average amount of the carbon material comprising the $sp^3$ hybridization varies along a thickness direction of the functional structure; or wherein an average amount of the carbon material comprising an $sp^2$ hybridization varies along a thickness direction of the functional structure, wherein an average amount of the carbon material within the carbon layer material varies within the functional layer along a thickness direction of the functional structure, and wherein the carbon material is doped with a dopant of at least one material, and wherein the average amount of the carbon material varies along the thickness direction based on a varying degree of doping of the carbon material with the dopant of the at least one material along the thickness direction, wherein the dopant is a metal, a transition metal and/or a metalloid comprising silicon.

* * * * *